(12) United States Patent
Tsai et al.

(10) Patent No.: US 12,708,011 B2
(45) Date of Patent: Aug. 11, 2026

(54) SEMICONDUCTOR DEVICE, PACKAGE STRUCTURE AND METHOD OF FABRICATING THE SAME

(71) Applicant: Taiwan Semiconductor Manufacturing Company, Ltd., Hsinchu (TW)

(72) Inventors: Tsung-Fu Tsai, Changhua County (TW); Ying-Ching Shih, Hsinchu City (TW); Szu-Wei Lu, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1 day.

(21) Appl. No.: 18/471,319

(22) Filed: Sep. 21, 2023

(65) Prior Publication Data

US 2024/0014162 A1 Jan. 11, 2024

Related U.S. Application Data

(62) Division of application No. 17/407,172, filed on Aug. 19, 2021.

(51) Int. Cl.
*H10W 70/685* (2026.01)
*H10W 70/00* (2026.01)
(Continued)

(52) U.S. Cl.
CPC ........ *H10W 70/685* (2026.01); *H10W 70/611* (2026.01); *H10W 70/635* (2026.01); *H10W 70/66* (2026.01); *H10W 90/00* (2026.01); *H10W 70/099* (2026.01); *H10W 70/60* (2026.01); *H10W 70/6528* (2026.01); *H10W 72/072* (2026.01); *H10W 72/07207* (2026.01);
(Continued)

(58) Field of Classification Search
None
See application file for complete search history.

(56) References Cited

U.S. PATENT DOCUMENTS 5,440,805 A * 8/1995 Daigle ................ H01L 21/4857 174/262
9,000,584 B2 4/2015 Lin et al.
(Continued)

*Primary Examiner* — Jessica S Manno
*Assistant Examiner* — Christopher A. Schodde
(74) *Attorney, Agent, or Firm* — JCIPRNET

(57) ABSTRACT

A package structure includes a semiconductor die, a first insulating encapsulant, a plurality of first conductive features, an interconnect structure and bump structures. The semiconductor die includes a plurality of conductive pillars made of a first material. The first insulating encapsulant is encapsulating the semiconductor die. The first conductive features are disposed on the semiconductor die and electrically connected to the conductive pillars. The first conductive features include at least a second material different from the first material. The interconnect structure is disposed on the first conductive features, wherein the interconnect structure includes a plurality of connection structures made of the second material. The bump structures are electrically connecting the first conductive features to the connection structures, wherein the bump structures include a third material different from the first material and the second material.

20 Claims, 25 Drawing Sheets

(51) Int. Cl.

| | |
|---|---|
| ***H10W 70/60*** | (2026.01) |
| ***H10W 70/63*** | (2026.01) |
| ***H10W 70/652*** | (2026.01) |
| ***H10W 70/66*** | (2026.01) |
| ***H10W 72/00*** | (2026.01) |
| ***H10W 72/20*** | (2026.01) |
| ***H10W 74/01*** | (2026.01) |
| ***H10W 74/15*** | (2026.01) |
| ***H10W 90/00*** | (2026.01) |
| ***H10W 90/22*** | (2026.01) |
| ***H10W 99/00*** | (2026.01) |

(52) U.S. Cl.

CPC ................. *H10W 72/07236* (2026.01); *H10W 72/07255* (2026.01); *H10W 72/073* (2026.01); *H10W 72/252* (2026.01); *H10W 72/2528* (2026.01); *H10W 72/853* (2026.01); *H10W 74/019* (2026.01); *H10W 74/15* (2026.01); *H10W 90/22* (2026.01); *H10W 90/722* (2026.01); *H10W 90/724* (2026.01); *H10W 90/732* (2026.01); *H10W 90/734* (2026.01); *H10W 99/00* (2026.01)

(56) References Cited

U.S. PATENT DOCUMENTS

| | | | | |
|---|---|---|---|---|
| 9,048,222 | B2 | 6/2015 | Hung et al. | |
| 9,048,233 | B2 | 6/2015 | Wu et al. | |
| 9,064,874 | B2 | 6/2015 | Edelstein et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,372,206 | B2 | 6/2016 | Wu et al. | |
| 9,496,189 | B2 | 11/2016 | Yu et al. | |
| 2003/0043558 | A1* | 3/2003 | Shirasaki | H05K 1/0243 361/767 |
| 2003/0219623 | A1* | 11/2003 | Kao | B23K 35/262 257/E23.021 |
| 2005/0012216 | A1* | 1/2005 | Leong | H01L 23/49816 257/751 |
| 2005/0161829 | A1* | 7/2005 | Zeng | H01L 24/10 257/772 |
| 2006/0019490 | A1* | 1/2006 | Chou | H01L 24/03 257/E23.021 |
| 2008/0251940 | A1* | 10/2008 | Lee | H01L 24/16 257/E23.141 |
| 2011/0139314 | A1* | 6/2011 | Ho | H01L 24/11 148/528 |
| 2011/0193227 | A1* | 8/2011 | Chuang | H01L 23/49816 257/E23.129 |
| 2016/0260677 | A1* | 9/2016 | Hsiao | H01L 25/0657 |
| 2016/0276299 | A1* | 9/2016 | Migita | H01L 25/0657 |
| 2017/0250091 | A1* | 8/2017 | Yu | H01L 21/56 |
| 2017/0345795 | A1* | 11/2017 | Yang | H01L 24/09 |
| 2018/0005951 | A1* | 1/2018 | Lin | H01L 21/265 |
| 2019/0096840 | A1* | 3/2019 | Ang | H01L 24/24 |
| 2019/0287895 | A1* | 9/2019 | Tajima | H01L 21/561 |
| 2020/0020633 | A1* | 1/2020 | Chang | H01L 21/565 |
| 2020/0395281 | A1* | 12/2020 | Chien | H01L 23/49822 |
| 2021/0098380 | A1* | 4/2021 | Chen | H01L 21/565 |
| 2021/0134746 | A1* | 5/2021 | Chang | C08G 73/10 |
| 2021/0249381 | A1* | 8/2021 | Knickerbocker | H01L 21/563 |
| 2022/0093543 | A1* | 3/2022 | Seo | H01L 24/81 |

* cited by examiner 104B
104A
104
102

107
105
104B
104A
104
102
107E
107B
107A
107D
107C
106
106C
106D
106B
106E
106A
105

SEMICONDUCTOR DEVICE, PACKAGE STRUCTURE AND METHOD OF FABRICATING THE SAME

CROSS-REFERENCE TO RELATED APPLICATION

This application is a divisional application of and claims the priority benefit of a prior application Ser. No. 17/407,172, filed on Aug. 19, 2021. The entirety of the above-mentioned patent application is hereby incorporated by reference herein and made a part of this specification.

BACKGROUND

Semiconductor devices and integrated circuits used in a variety of electronic applications, such as cell phones and other electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1, 2:
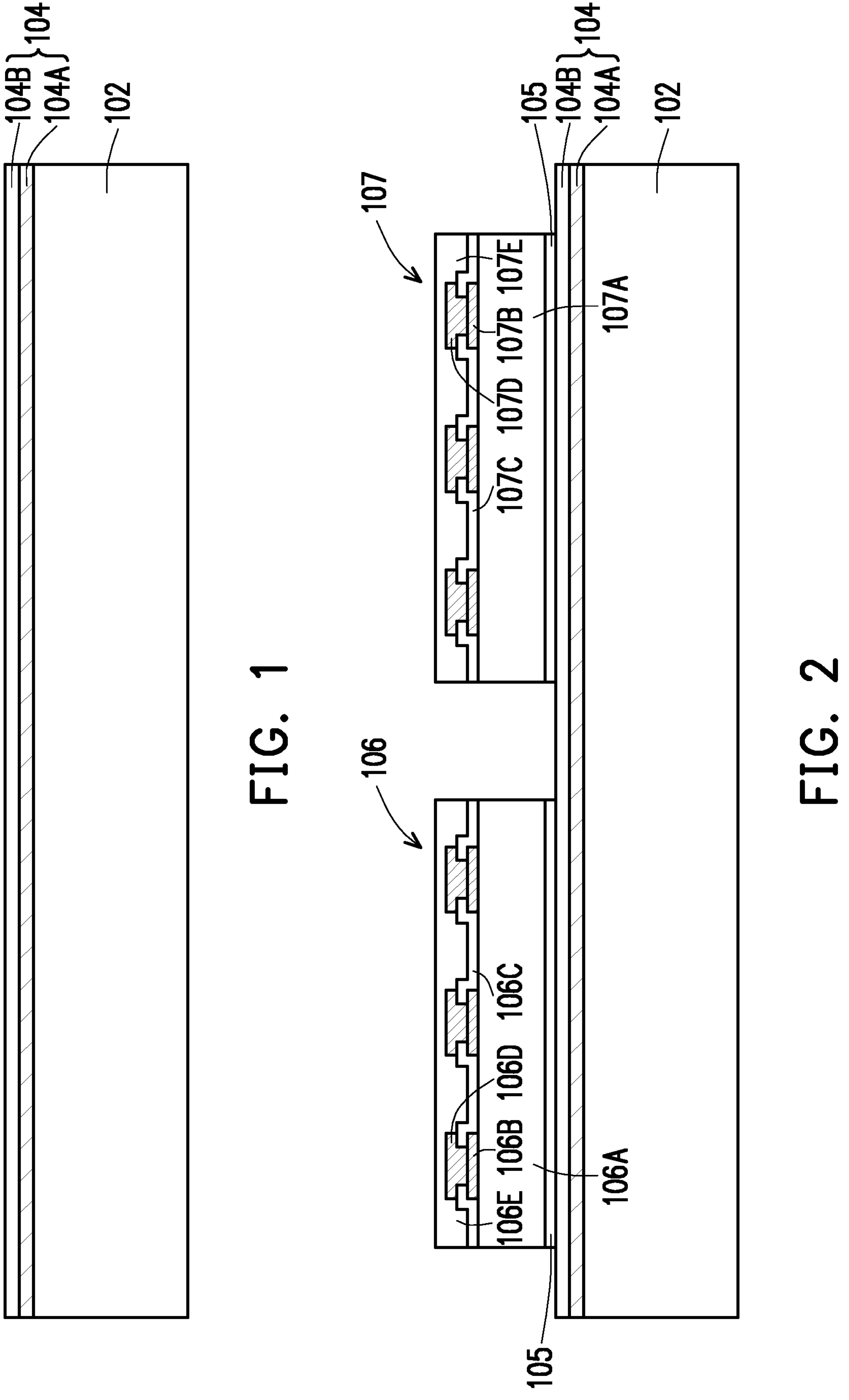
FIG. 1 to FIG. 13 are schematic sectional views of various stages in a method of fabricating a package structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 13 are schematic sectional views of various stages in a method of fabricating a package structure according to some exemplary embodiments of the present disclosure. Referring to FIG. 1, a carrier 102 with a buffer layer 104 coated thereon is provided. In one embodiment, the carrier 102 may be a glass carrier or any suitable carrier for carrying a semiconductor wafer or a reconstituted wafer used in a method of fabricating the package structure.

In some embodiments, the buffer layer 104 includes a de-bonding layer 104A and a dielectric layer 104B, wherein the de-bonding layer 104A is located in between the carrier 102 and the dielectric layer 104B. In certain embodiments, the de-bonding layer 104A is disposed on the carrier 102, and the material of the de-bonding layer 104A may be any material suitable for bonding and de-bonding the carrier 102 from the above layer(s) (e.g., the dielectric layer 104B) or any wafer(s) disposed thereon. In some embodiments, the de-bonding layer 104A may include a release layer (such as a light-to-heat conversion (“LTHC”) layer) or an adhesive layer (such as an ultra-violet curable adhesive or a heat curable adhesive layer). In some embodiments, the dielectric layer 104B may be formed above the de-bonding layer 104A. The dielectric layer 104B may be made of dielectric materials such as benzocyclobutene (“BCB”), polybenzoxazole (“PBO”), or any other suitable polymer-based dielectric material. It is noted that the materials of the carrier 102, the de-bonding layer 104A and the dielectric layer 104B are not limited to the descriptions of the embodiments. In some alternative embodiments, the dielectric layer 104B may be optionally omitted; in other words, merely the de-bonding layer 104A is formed over the carrier 102.

Referring to FIG. 2, a first semiconductor die 106 and a second semiconductor die 107 are placed on the buffer layer 104 by, e.g. a pick-and-place process. In some embodiments, the first semiconductor die 106 and the second semiconductor die 107 are placed to the buffer layer 104 trough a die-attach film 105. In the exemplary embodiment, each of the first semiconductor die 106 and the second semiconductor die 107 includes a semiconductor substrate (106A/107A), a plurality of conductive pads (106B/107B), a passivation layer (106C/107C), a plurality of conductive pillars (106D,107D), and a protection layer (106E, 107E).

As illustrated in FIG. 2, the plurality of conductive pads (106B/107B) is disposed on the semiconductor substrate (106A/107A). The passivation layer (106C/107C) is formed over the semiconductor substrate (106A/107A) and has openings that partially expose the conductive pads (106B/107B) on the semiconductor substrate (106A/107A). The semiconductor substrate (106A/107A) may be a bulk silicon substrate or a silicon-on-insulator (SOI) substrate, and further includes active components (e.g., transistors or the like) and optionally passive components (e.g., resistors, capacitors, inductors or the like) formed therein. The conductive pads (106B/107B) may be aluminum pads, copper pads or other suitable metal pads. The passivation layer (106C/107C) may be a silicon oxide layer, a silicon nitride layer, a silicon oxy-nitride layer or a dielectric layer formed of any suitable dielectric materials.

Furthermore, in some embodiments, a post-passivation layer (not shown) is optionally formed over the passivation layer (106C/107C). The post-passivation layer covers the passivation layer (106C/107C) and has a plurality of contact openings. The conductive pads (106B/107B) are partially exposed by the contact openings of the post passivation layer. The post-passivation layer may be a benzocyclobutene (BCB) layer, a polyimide layer, a polybenzoxazole (PBO) layer, or a dielectric layer formed by other suitable polymers. In some embodiments, the conductive pillars (106D, 107D) are formed on the conductive pads (106B,107B) by plating. The conductive pillars (106D,107D) may be made of a first material, for example, the first material may be copper, or the like. In some embodiments, the protection layer (106E, 107E) is formed on the passivation layer (106C/107C) or on the post passivation layer, and covering the conductive pillars (106D,107D) so as to protect the conductive pillars (106D,107D).

In some embodiments, the first semiconductor die 106 may be a logic device, such as a central processing unit (CPU), graphics processing unit (GPU), system-on-a-chip (SoC), microcontroller, or the like. The second semiconductor die 107 may be a memory device, such as a dynamic random access memory (DRAM) die, static random access memory (SRAM) die, hybrid memory cube (HMC) module, a high bandwidth memory (HBM) module, or the like. In some embodiments, the first semiconductor die 106 and the second semiconductor die 107 may be may be the same type of dies, such as SoC dies. The first semiconductor die 106 and the second semiconductor die 107 may have different sizes (e.g., different heights and/or surface areas), or may have the same size (e.g., same heights and/or surface areas).

Figure 3:
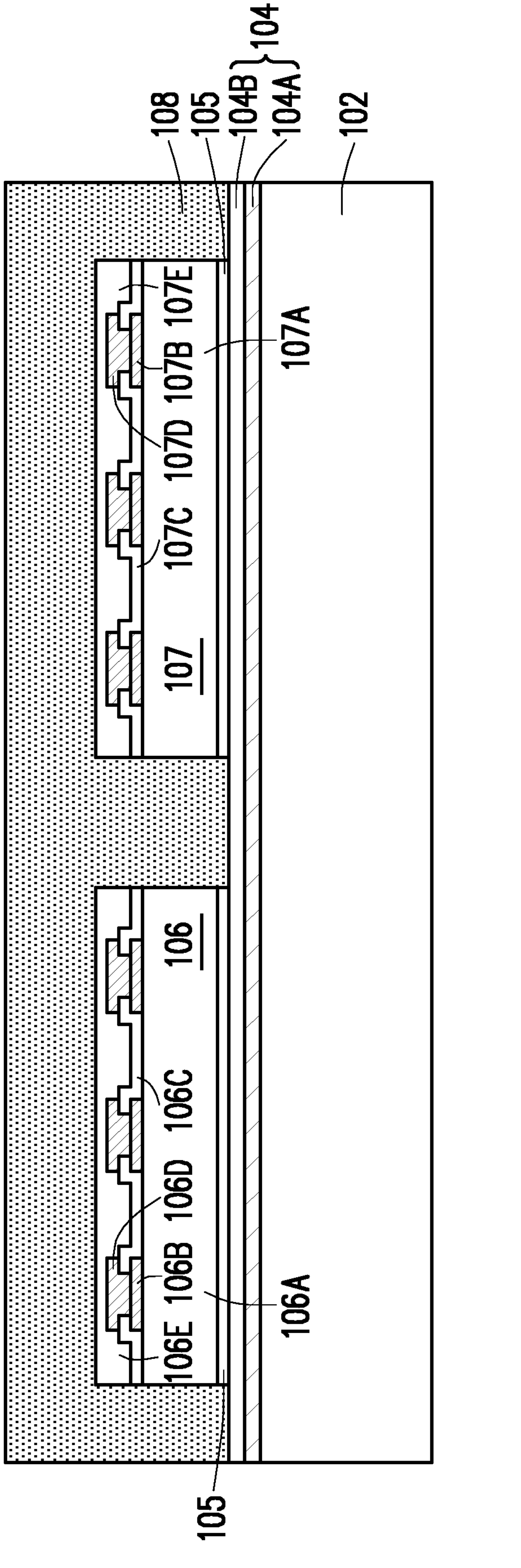

Referring to FIG. 3, after placing the first semiconductor die 106 and the second semiconductor die 107 on the buffer layer 104, an insulating material 108 is formed over the buffer layer 104 to cover the first semiconductor die 106 and the second semiconductor die 107. In some embodiments, the insulating material 108 is formed through, for example, a compression molding process, filling up the gaps between the semiconductor dies (106/107) and encapsulating the semiconductor dies (106/107). At this stage, the conductive pillars (106D/107D) and the protection layer (106E/107E) of the semiconductor dies (106/107) are encapsulated by and well protected by the insulating material 108. In other words, the conductive pillars (106D/107D) and the protection layer (106E/107E) of the semiconductor dies (106/107) are not revealed and are well protected by the insulating material 108.

In some embodiments, the insulating material 108 for example, include polymers (such as epoxy resins, phenolic resins, silicon-containing resins, or other suitable resins), dielectric materials having low permittivity (Dk) and low loss tangent (Df) properties, or other suitable materials. In certain embodiments, the insulating material 108 may further include inorganic filler or inorganic compounds (e.g. silica, clay, and so on) which can be added therein to optimize coefficient of thermal expansion (CTE) of the insulating material 108. The disclosure is not limited thereto.

Figure 4:
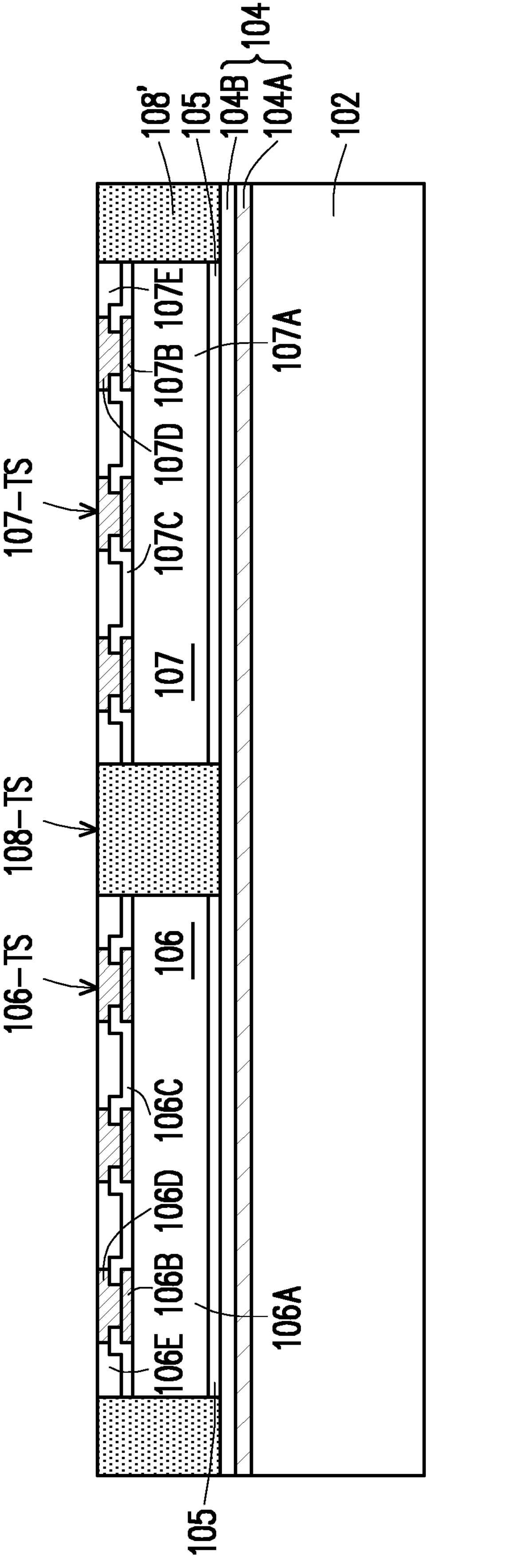

Referring to FIG. 4, in a subsequent step, the insulating material 108 is partially removed to expose the conductive pillars (106D/107D) of the first semiconductor die 106 and the second semiconductor die 107. In some embodiments, the insulating material 108 and the protection layer (106E/107E) are ground or polished by a planarization step. For example, the planarization step is performed through a mechanical grinding process and/or a chemical mechanical polishing (CMP) process until the top surfaces (106-TS/107-TS) of the conductive pillars (106D/107D) are revealed. In some embodiments, the insulating material 108 is polished to form an insulating encapsulant 108'. In some embodiments, after the planarization step, the top surfaces (106-TS/107-TS) of the conductive pillars (106D/107D), and the top surface 108-TS of the insulating encapsulant 108' are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 5:
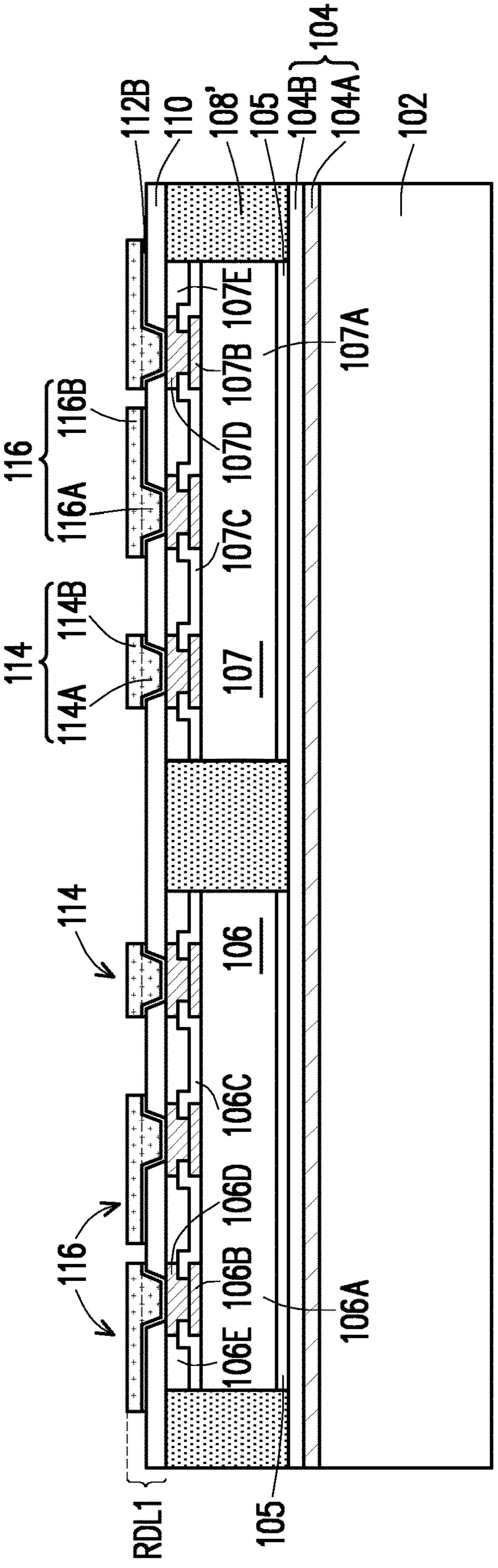

Referring to FIG. 5, in a subsequent step, a redistribution layer RDL1 may be formed on the insulating encapsulant 108', and over the first semiconductor die 106 and the second semiconductor die 107. In some embodiments, forming the redistribution layer RDL1 includes forming a dielectric layer 110 disposed on the insulating encapsulant 108', and forming first conductive features 114 and second conductive features 116 on the dielectric layer 110. In some embodiments, the dielectric layer 110 may be formed of a photosensitive material which may be patterned using a lithography mask, such as PBO, polyimide, a BCB-based polymer, a cyclic olefin copolymer, an acryl-based copolymer, or the like, which may be formed by spin coating, lamination, chemical vapor deposition (CVD), or the like. Other acceptable dielectric materials formed by any acceptable process may be used. In some embodiments, the dielectric layer 110 may be patterned to form openings revealing the conductive pillars (106D/107D) of the first semiconductor die 106 and second semiconductor die 107.

In some embodiments, the first conductive features 114 and the second conductive features 116 are formed on the dielectric layer 110, and fill into the openings of the dielectric layer 110. For example, the first conductive features 114 and the second conductive features 116 are electrically connected to the conductive pillars (106D/107D) of the first semiconductor die 106 and second semiconductor die 107. In some embodiments, prior to forming the first conductive features 114 and the second conductive features 116, a seed layer (not shown) may be formed conformally over the dielectric layer 110 and within the openings of the dielectric layer 110. Thereafter, a conductive material may be formed over the seed layer, whereby the seed layer is patterned to form seed layers 112A, 112B, and the conductive material is patterned to form the first conductive features 114 and the second conductive features 116. In some embodiments, the seed layer 112A is sandwiched in between the conductive pillars (106D/107D) and the first conductive features 114, while the seed layer 112B is sandwiched in between the conductive pillars (106D/107D) and the second conductive features 116. In some embodiments, the seed layers 112A, 112B are formed by electroless plating, chemical vapor deposition (CVD), physical vapor deposition (PVD), atomic layer deposition (ALD), high density plasma CVD (HDPCVD) or combinations thereof. In one embodiment, the seed layers 112A, 112B are formed by sequentially depositing or sputtering a titanium layer and a copper layer.

As further illustrated in FIG. 5, the first conductive features 114 includes a first via portion 114A and a first body portion 114B. For example, the first via portion 114A is disposed within the openings of the dielectric layer 110 and surrounded by the seed layer 112A. The first via portion 114A is attached or electrically connected to the conductive pillars (106D/107D) through the seed layer 112A. The first body portion 114B is disposed on the first via portion 114A and formed over the seed layer 112A and the dielectric layer 110. Similarly, the second conductive features 116 includes a second via portion 116A and a second body portion 116B. For example, the second via portion 116A is disposed within the openings of the dielectric layer 110 and surrounded by the seed layer 112A. The second via portion 116A is attached or electrically connected to the conductive pillars (106D/107D) through the seed layer 112A. The second body portion 116B is disposed on the second via portion 116A and formed over the seed layer 112A and the dielectric layer 110.

In some embodiments, the first conductive features 114 and the second conductive features 116 are made of a second material different from the first material of the conductive pillars (106D/107D). For example, in one embodiment, the second material is nickel while the first material is copper. The first conductive features 114 and the second conductive features 116 may be formed by electroplating or deposition, and may be patterned using a photolithography and etching process.

Figure 6:
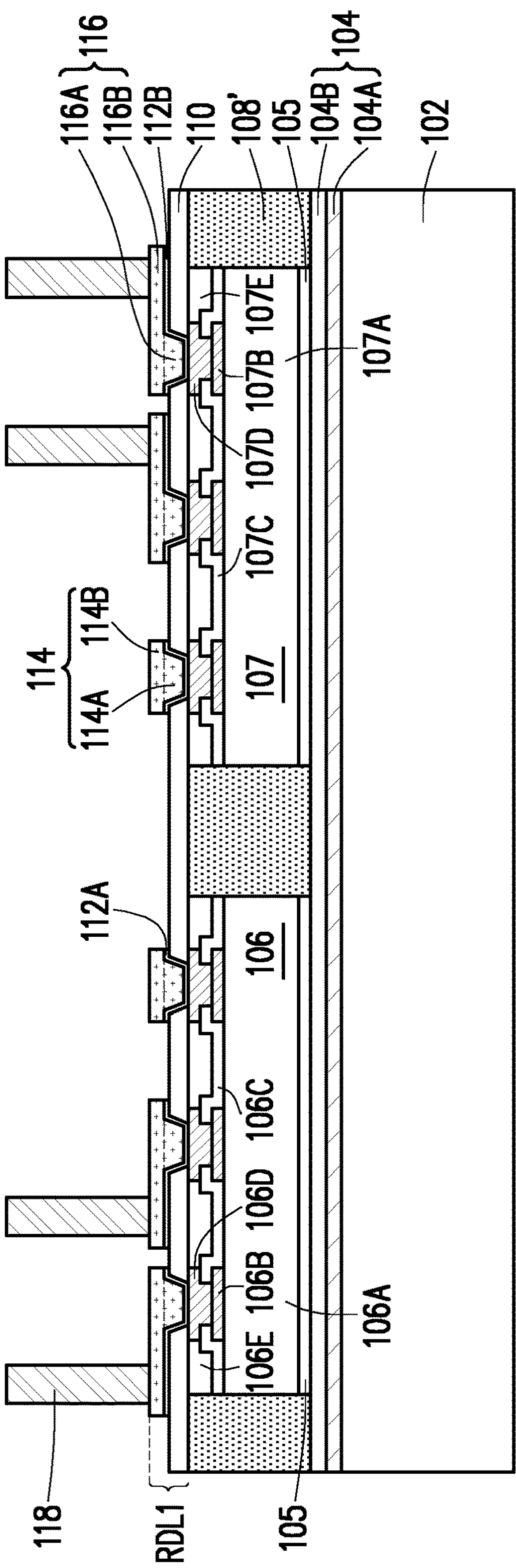

Referring to FIG. 6, in a subsequent step, a plurality of through vias 118 may be formed on the second conductive features 116. For example, the through vias 118 are disposed on and electrically connected to the second body portion 116B of the second conductive features 116. In some embodiments, the formation of the through vias 118 includes forming a mask pattern (not shown) with openings, then forming a metallic material (not shown) filling up the openings by electroplating or deposition, and removing the mask pattern to form the through vias 118. In some embodiments, the through vias 118 are made of the first material. For example, the through vias 118 may include a metal material such as copper or copper alloys, or the like.

Figure 7:
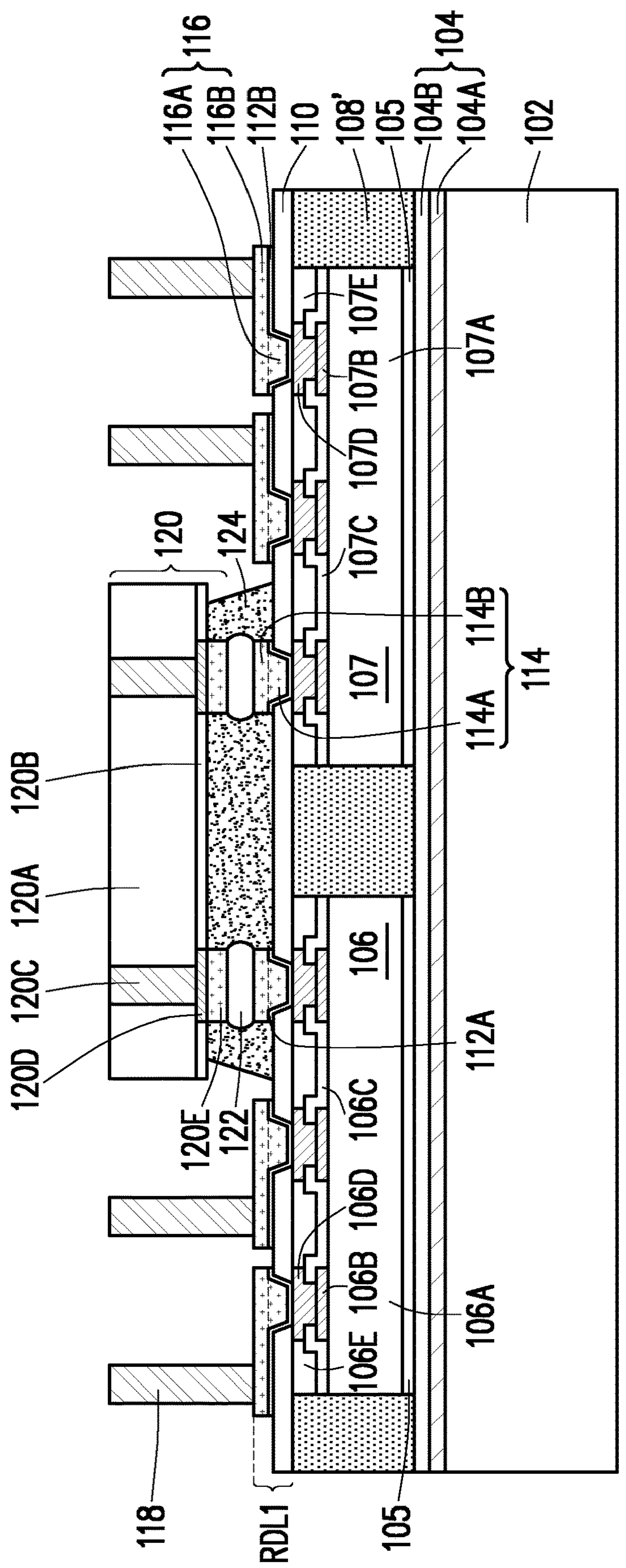

Referring to FIG. 7, after forming the through vias 118, an interconnection structure 120 is disposed on the first conductive features 114 to be electrically connected to the first conductive features 114. The interconnect structure 120 may be local silicon interconnects (LSIs), large scale integration packages, interposer dies, or the like. In some embodiments, the interconnection structure 120 includes a substrate 120A, a dielectric layer 120B, through substrate vias 120C, conductive pads 120D and connection structures 120E. The substrate 120A may be semiconductor substrates, dielectric layers, or the like. The through substrate vias 120C extend through the substrate 120A, and are exposed at back sides of the interconnect structure. The dielectric layer 120B is disposed on the substrate 120A. The conductive pads 120D are surrounded by the dielectric layer 120B, while being electrically connected to the through substrate vias 120C. Furthermore, the connection structures 120E are disposed on and electrically connected to the conductive pads 120D.

In some embodiments, where the interconnect structure 120 are LSI, the interconnect structure 120 may include bridge structures (not shown) for electrically connecting the first semiconductor die 106 to the second semiconductor due 107. For example, the bridge structures may be electrically connected to some of the connection structures 120E. In one embodiment, the connection structures 120E are made of the second material similar to that of the first conductive features 114. For example, in some embodiments, both the connection structures 120E and the first conductive features 114 are made of nickel. In certain embodiments, a material of the connection structures 120E is different than materials of the conductive pads 120D and the through substrate vias 120C.

As further illustrated in FIG. 7, in some embodiments, bump structures 122 are provided in between the first conductive features 114 and the connection structures 120E, and a reflow process is performed so that the bump structures 122 are electrically connected to the first conductive features 114 and the connection structures 120E. In certain embodiments, the interconnect structure 120 is electrically connected to the first semiconductor die 106 and the second semiconductor die 107 through the bump structures 122 and the first conductive features 114.

In some embodiments, the bump structures 122 are made of at least a third material different from the first material of the conductive pillars (106D/107D), and different from the second material of the first conductive features 114 and the connection structures 120E. For example, the third material includes a conductive material such as solder, or the like. In certain embodiments, the first material is copper, the second material is nickel, while the third material is tin. In one embodiment, the bump structures 122 are formed by initially forming a layer of solder through evaporation, electroplating, printing, solder transfer, ball placement, or the like. Thereafter, the reflow process may be performed in order to shape the solder material, and so that the bump structures 112 are joined with the first conductive features 114 and the connection structures 120E.

After placing the interconnect structure 120 on the first conductive features 114, an underfill structure 124 may be formed to fill up the gaps in between the interconnect structure 120 and the redistribution layer RDL1. For example, the underfill structure 124 covers and surrounds the connection structures 120E, the bump structures 122 and the first body portion 114B of the first conductive features 114. The underfill structure 124 may reduce stress and protect the joints resulting from the reflowing of the bump structures 122. The underfill structure 124 may be applied in liquid or semi-liquid form and then subsequently cured.

Figures 8A, 8B, 8C:
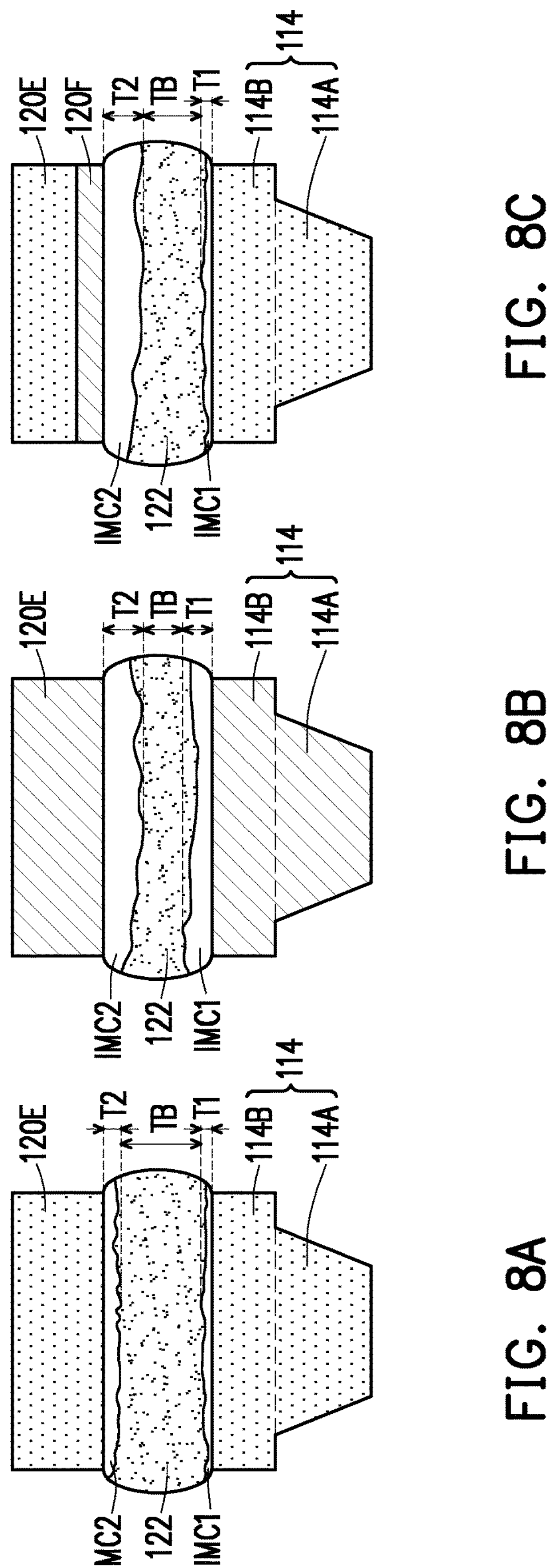

FIG. 8A is an enlarged view of the joints between the connection structures 120E, the bump structures 122 and the first conductive features 114 shown in FIG. 7. In the exemplary embodiment, after performing the reflow process to join the bump structures 122 to the connection structures 120E and the first conductive features 114, a first intermetallic compound IMC1 and a second intermetallic compound IMC2 may be formed. In some embodiments, the first intermetallic compound IMC1 is formed between the first conductive features 114 and the bump structures 122, while the second intermetallic compound IMC2 is formed between the connection structures 120E and the bump structures 122. In the exemplary embodiment, since the first conductive features 114 and the connection structures 120E are made of the second material (e.g. nickel), the first intermetallic compound IMC1 and the second intermetallic compound IMC2 may include Ni—Sn based intermetallic compounds. For example, in one embodiment, the first intermetallic compound IMC1 and the second intermetallic compound IMC2 may be $Ni_3Sn_4$.

As illustrated in FIG. 8A, the first intermetallic compound IMC1 has a maximum thickness of T1, the second intermetallic compound IMC2 has a maximum thickness of T2, while the bump structures 122 have a minimum thickness of TB. In some embodiments, taking a sum of the thickness T1 of the first intermetallic compound IMC1 and the thickness TB of the bump structures 122 as 100%, the thickness T1 of the first intermetallic compound is in a range of 5% to 20% (T1/(T1+TB)). In certain embodiments, taking a sum of the thickness T1 of the first intermetallic compound IMC1 and the thickness TB of the bump structures 122 as 100%, the thickness T1 of the first intermetallic compound is in a range of 5% to 10% (T1/(T1+TB)).

In a similar way, taking a sum of the thickness T2 of the second intermetallic compound IMC2 and the thickness TB of the bump structures as 100%, the thickness T2 of the second intermetallic compound is in a range of 5% to 20% (T2/(T2+TB)). In certain embodiments, taking a sum of the thickness T2 of the second intermetallic compound IMC2 and the thickness TB of the bump structures as 100%, the thickness T2 of the second intermetallic compound IMC2 is in a range of 5% to 10% (T2/(T2+TB)).

By using the second material (e.g. nickel) as a material of the connection structures 120E and a material of the first conductive features 114, due to the less reactive nature of the second material, the joints of the connection structures 120E and the first conductive features 114 with the bump structures 122 will result in less intermetallic compound formation. That is, the thicknesses of the first intermetallic compound IMC1 and the second intermetallic compound IMC2 can be controlled in the above range, a joint yield may be improved, and there would be less reliability concerns.

FIG. 8B and FIG. 8C are enlarged views of the joints between the connection structures 120E, the bump structures 122 and the first conductive features 114 according to some comparative embodiments of the present disclosure.

In the comparative embodiment shown in FIG. 8B, the connection structures 120E and the first conductive features 114 are made of copper. As such, after performing the reflow process to join the bump structures 122 to the connection structures 120E and the first conductive features 114, the first intermetallic compound IMC1 and the second intermetallic compound IMC2 will be formed with a greater thickness (T1, T2). For example, taking a sum of the thickness T1 of the first intermetallic compound IMC1 and the thickness TB of the bump structures 122 as 100%, the thickness T1 of the first intermetallic compound is in a range of 25% to 55% (T1/(T1+TB)). Similarly, taking a sum of the thickness T2 of the second intermetallic compound IMC2 and the thickness TB of the bump structures as 100%, the thickness T2 of the second intermetallic compound IMC2 is in a range of 25% to 55% (T2/(T2+TB)). Due to the faster reaction of the copper material to form $Cu_6Sn_5$ intermetallic compounds, the thicknesses of the first intermetallic compound IMC1 and the second intermetallic compound IMC2 will be increased. As a result, poor joints may be caused due to the formation of the rough and thick $Cu_6Sn_5$ intermetallic compound, and there will be reliability concerns between the joints of the connection structures 120E, the bump structures 122 and the first conductive features 114.

In the comparative embodiment shown in FIG. 8C, the connection structures 120E and the first conductive features 114 are made of nickel, but an extra copper layer 120F is formed on the connection structures 120E for connecting to the bump structures 122. In such embodiment, after performing the reflow process to join the bump structures 122 to the connection structures 120E and the first conductive features 114, at least the second intermetallic compound IMC2 will be formed with a greater thickness (T2). For example, taking a sum of the thickness T2 of the second intermetallic compound IMC2 and the thickness TB of the bump structures as 100%, the thickness T2 of the second intermetallic compound IMC2 is in a range of 25% to 55% (T2/(T2+TB)). Due to the faster reaction of the copper material to form $Cu_6Sn_5$ intermetallic compounds, the thicknesses of the second intermetallic compound IMC2 will be increased. As a result, poor joints may be caused due to the formation of the rough and thick $Cu_6Sn_5$ intermetallic compound, and there will still be reliability concerns between the joints of the connection structures 120E, the bump structures 122 and the first conductive features 114.

Figure 9:
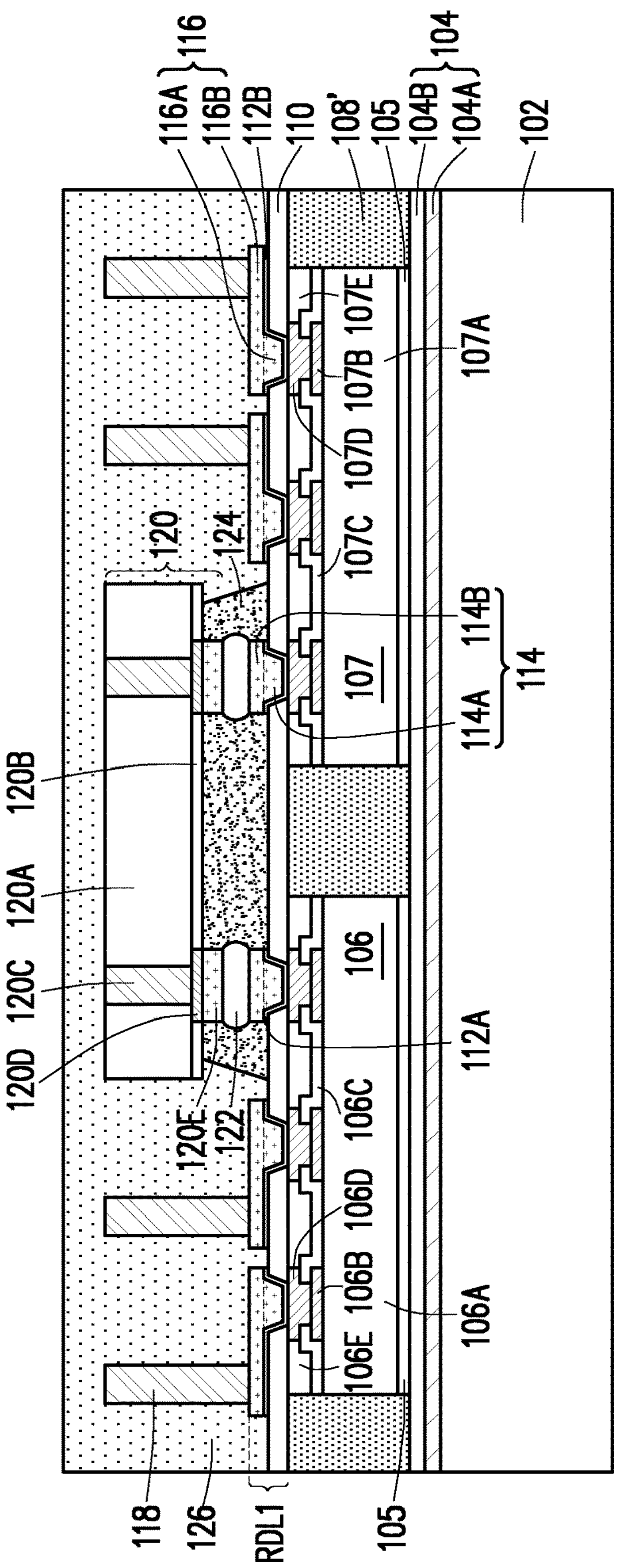

Referring to FIG. 9, after performing the reflow process to join the bump structures 122 to the connection structures 120E and the first conductive features 114, an insulating material 126 is formed over the dielectric layer 110 and the insulating encapsulant 108', and formed to encapsulate the interconnect structure 120 and the through vias 118. In some embodiments, the insulating material 126 is formed through, for example, a compression molding process, filling up the gaps between the interconnect structure 120 and adjacent through vias 118. At this stage, the interconnect structure 120 and the through vias 118 are encapsulated and well protected by the insulating material 126.

In some embodiments, the insulating material 126 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 126 may include an acceptable insulating encapsulation material. In some embodiments, the insulating material 126 may further include inorganic filler or inorganic compound (e.g. silica, clay, and so on) which can be added therein to optimize coefficient of thermal expansion (CTE) of the insulating material 126. In certain embodiments, the insulating material 126 may be the same or different than the insulating material 108. The disclosure is not limited thereto.

Figure 10:
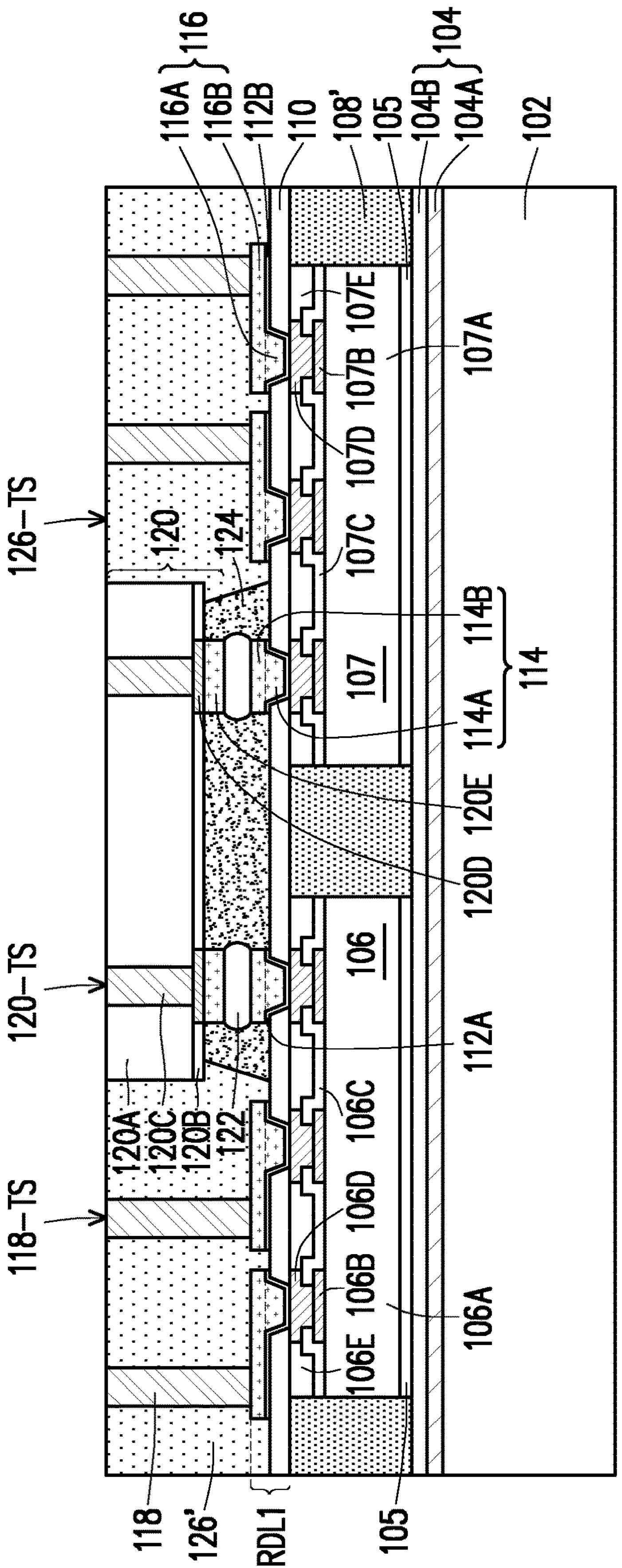

Referring to FIG. 10, in some embodiments, a thinning step is performed to form an insulating encapsulant 126'. For example, the thickness of the insulating material 126 is reduced until top surfaces 118-TS of the through vias 118 and top surfaces 120-TS of the through substrate vias 120C are revealed. In certain embodiments, the insulating material 126 is ground or polished by a mechanical grinding process and/or a chemical mechanical polishing (CMP) process to form the insulating encapsulant 126'. In some embodiments, the through vias 118 may be partially polished so that the top surfaces 118-TS of the through vias 118 are levelled with the top surfaces 120-TS of the through substrate vias 120C. In some embodiments, the top surface 126-TS of the insulating encapsulant 126', the top surface 118-TS of the through insulator vias 118, and the top surfaces 120-TS of the through substrate vias 120C are coplanar and levelled with one another.

Figure 11:
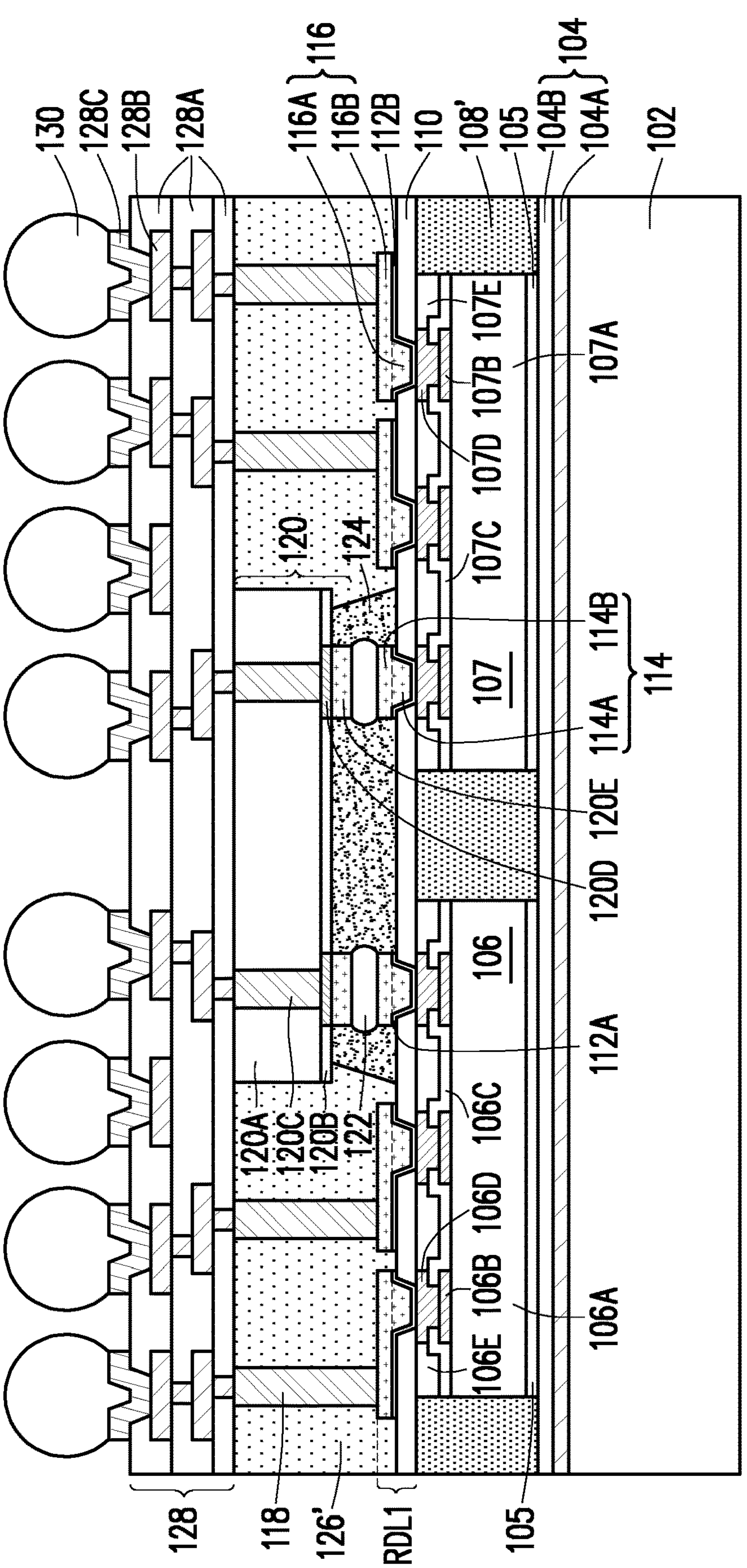

Referring to FIG. 11, after the thinning step, a redistribution layer 128 is formed on the insulating encapsulant 126' over the interconnect structure 120 and the through vias 118. In some embodiments, the redistribution layer 128 may include a plurality of dielectric layers 128A and a plurality of conductive elements 128B alternately stacked. Although only two layers of the conductive elements 128B and three layers of dielectric layers 128A are illustrated herein, however, the scope of the disclose is not limited by the embodiments of the disclosure. In other embodiments, the number of conductive elements 128B and the dielectric layers 128A may be adjusted based on product requirement. In some embodiments, the conductive elements 128B are electrically connected to first semiconductor die 106 and the second semiconductor die 107 through the through vias 118.

In some embodiments, the material of the dielectric layers 128A may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 128A are formed by suitable fabrication techniques such as spin-on coating, chemical vapor deposition (CVD), plasma-enhanced chemical vapor deposition (PECVD) or the like. The disclosure is not limited thereto.

In some embodiments, the material of the conductive elements 128B may be made of conductive materials formed by electroplating or deposition, such as aluminum, titanium, copper, nickel, tungsten, and/or alloys thereof, which may be patterned using a photolithography and etching process. In some embodiments, the conductive elements 128B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

After forming the redistribution layer 128, a plurality of conductive pads 128C may be disposed on an exposed top surface of the topmost layer of the conductive elements 128B for electrically connecting with conductive terminals (e.g. conductive balls). In certain embodiments, the conductive pads 128C are for example, under-ball metallurgy (UBM) patterns used for ball mount. As shown in FIG. 11, the conductive pads 128C are formed on and electrically connected to the redistribution layer 128. In some embodiments, the materials of the conductive pads 128C may include copper, nickel, titanium, tungsten, or alloys thereof or the like, and may be formed by an electroplating process, for example. The number of conductive pads 128C are not limited in this disclosure, and may be selected based on the design layout. In some alternative embodiments, the conductive pads 128C may be omitted. In other words, conductive terminals 130 formed in subsequent steps may be directly disposed on the redistribution layer 128.

As illustrated in FIG. 11, after forming the conductive pads 128C, a plurality of conducive terminals 130 are disposed on the conductive pads 128C and over the redistribution layer 128. In some embodiments, the conductive terminals 130 may be disposed on the conductive pads 128C by ball placement process or reflow process. In some embodiments, the conductive terminals 130 are, for example, solder balls or ball grid array (BGA) balls. In some embodiments, the conductive terminals 130 are connected to the redistribution layer 128 through the conductive pads 128C. In certain embodiments, some of the conductive terminals 130 may be electrically connected to the semiconductor dies (106/107) through the redistribution layer 128. The number of the conductive terminals 130 is not limited to the disclosure, and may be designated and selected based on the number of the conductive pads 128C.

Figure 12:
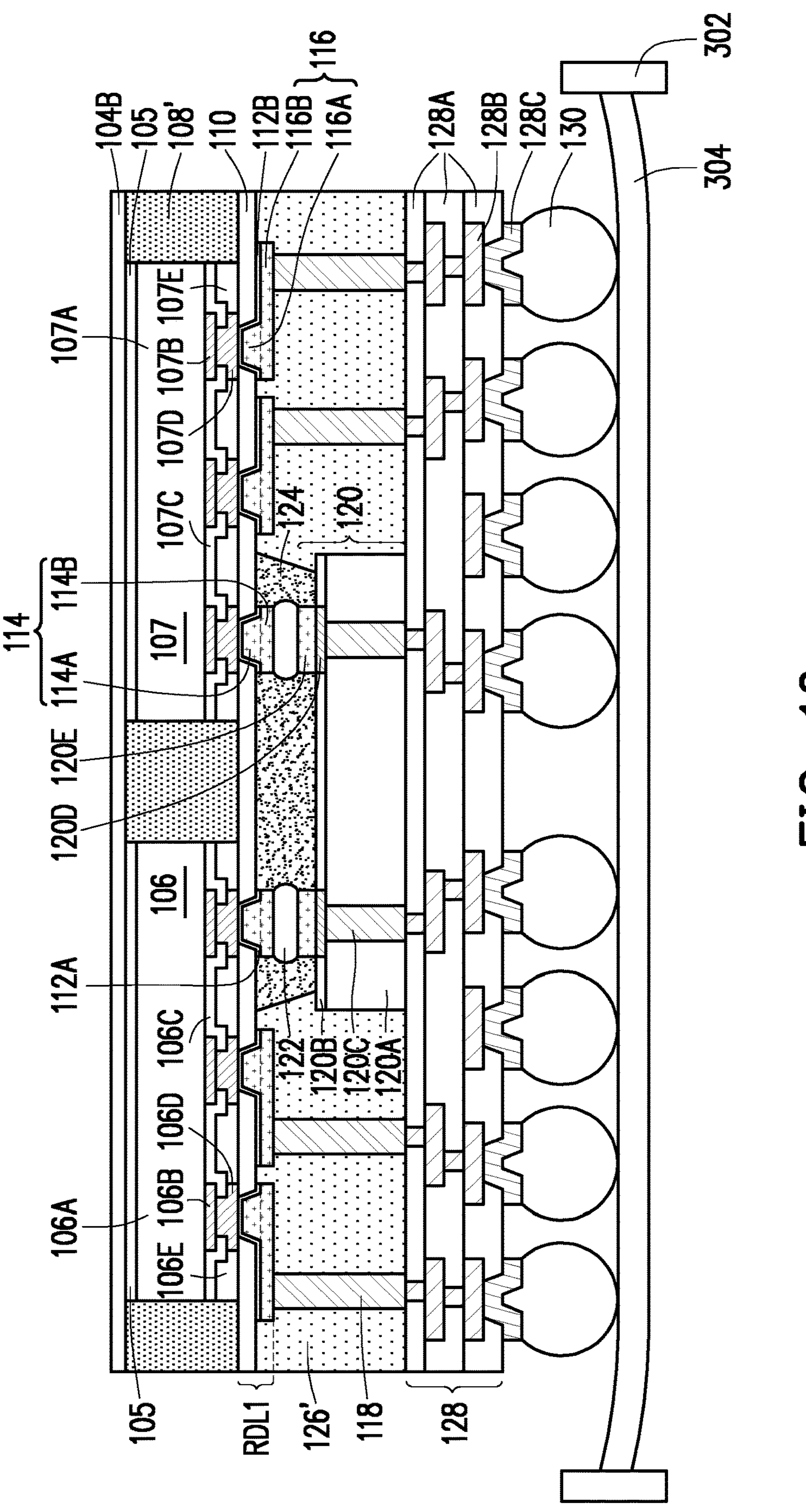

Referring to FIG. 12, after forming the redistribution layer 128 and placing the conductive terminals 130 thereon, the structure shown in FIG. 11 is turned upside down and attached to a tape 304 (e.g., a dicing tape 304) supported by a frame 302. In some embodiments, the carrier 102 is debonded so as to separate the first semiconductor die 106 and the second semiconductor die 107 from the carrier 102. In some embodiments, the de-bonding process include projecting a light such as a laser light or an UV light on the de-bonding layer 104A, so that the carrier 102 can be easily removed. In certain embodiments, the de-bonding layer 104A may be further removed or peeled off. After the de-bonding process, the dielectric layer 104B is revealed. In some alternative embodiments, the dielectric layer 104B is omitted, hence, the backside surfaces of the first semiconductor die 106 and the second semiconductor die 107 may be revealed. In some embodiments, a dicing or sawing process may be performed to separate individual packages from one another. For example, upon completion of the sawing process, a package structure PK1 (or semiconductor device) as illustrated in FIG. 13 according to some embodiments of the present disclosure is accomplished.

Figure 13:
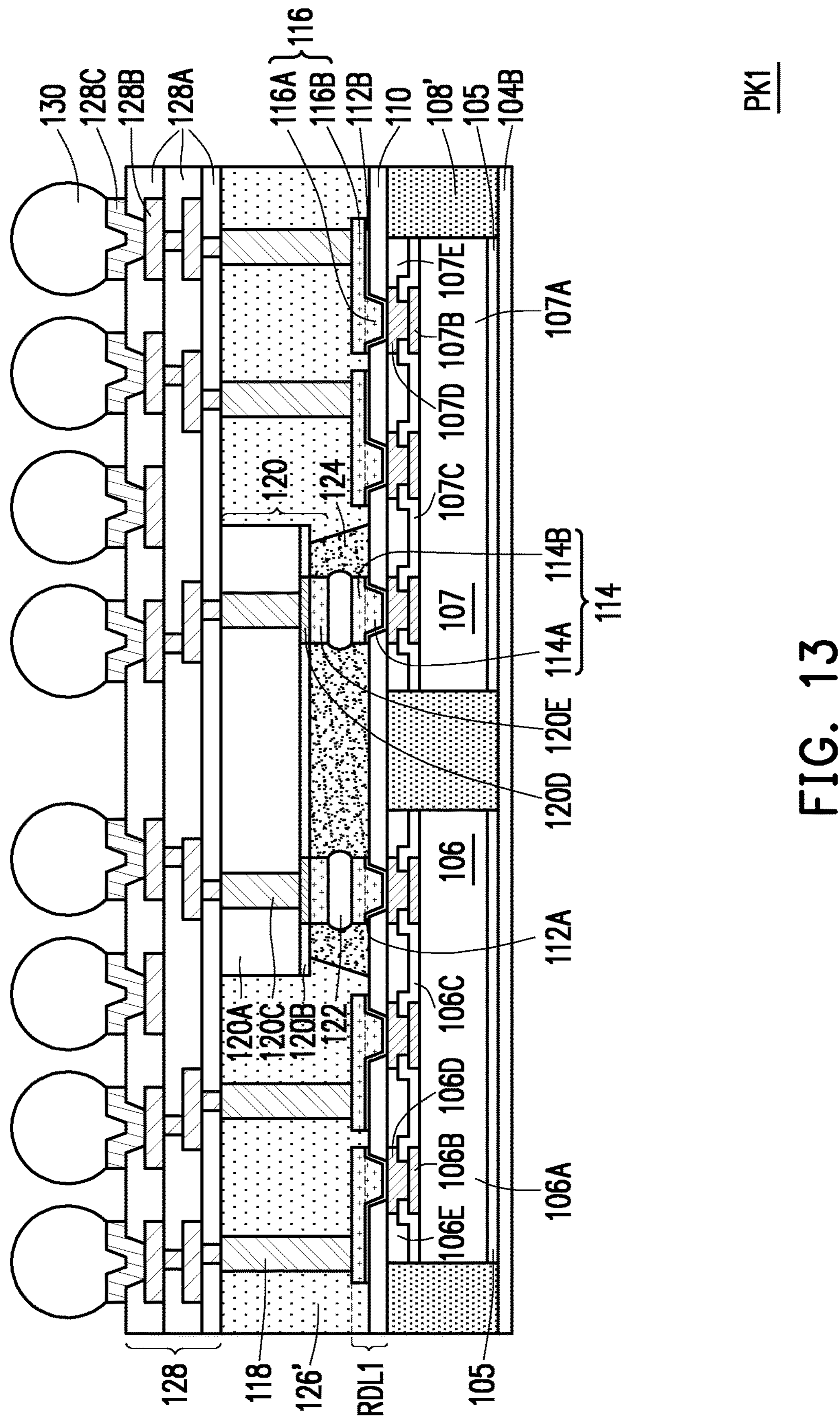
Figure 14:
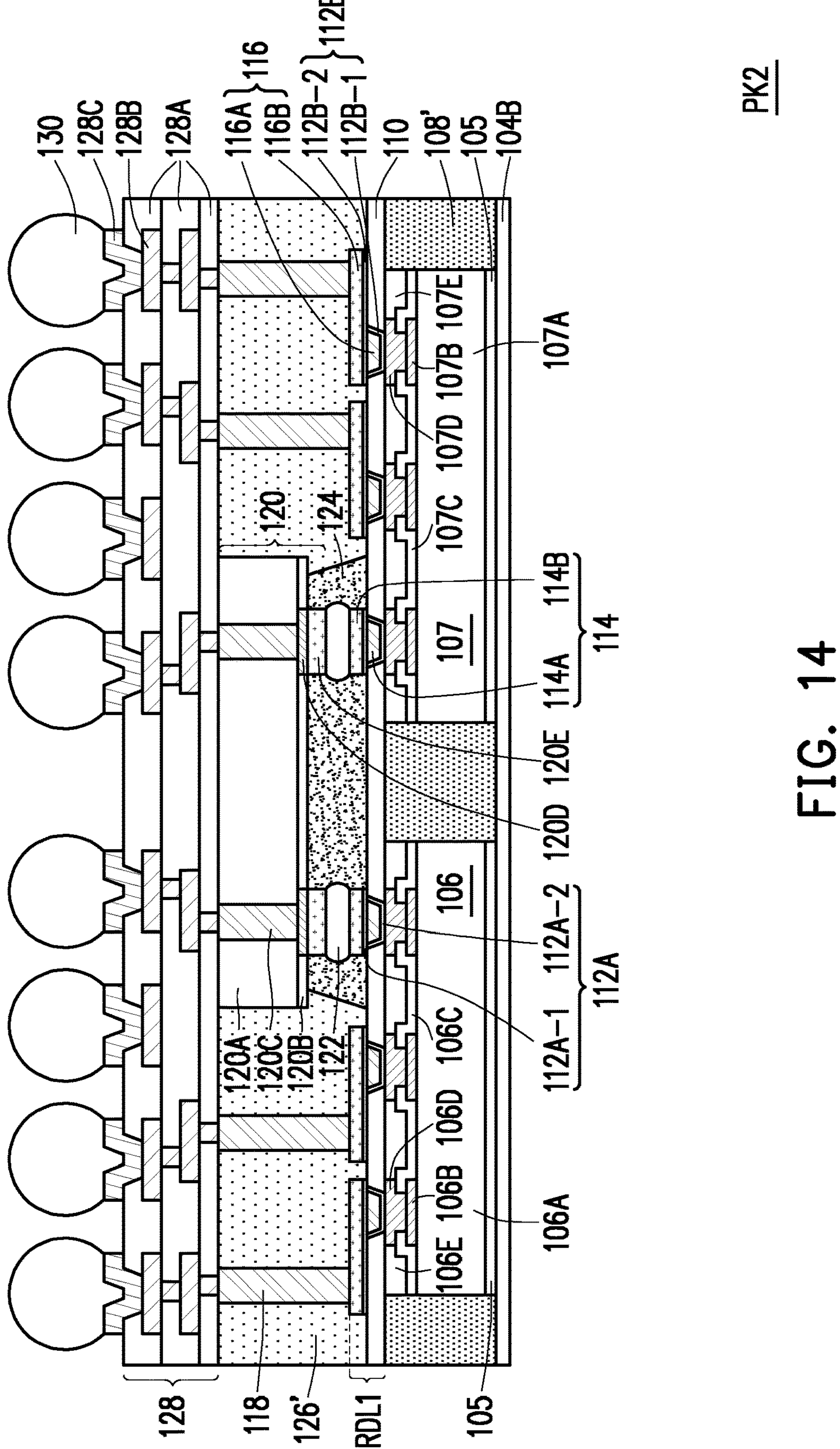
FIG. 14 is a schematic sectional view of a package structure according to some other embodiments of the present disclosure.

FIG. 14 is a schematic sectional view of a package structure according to some other embodiments of the present disclosure. The package structure PK2 (or semiconductor device) illustrated in FIG. 14 is similar to the package structure PK1 illustrated in FIG. 13. Therefore, the same reference numerals are used to refer to the same or liked parts, and its detailed description will be omitted herein. The difference between the embodiments is in the design of the first conductive features 114 and the second conductive features 116.

In FIG. 13, the first conductive features 114 includes a first via portion 114A and a first body portion 114B both made of the second material (e.g. nickel), and the second conductive features 116 includes a second via portion 116A and a second body portion 116B both made of the second material (e.g. nickel). However, the disclosure is not limited thereto. For example, referring to FIG. 14, the first via portion 114A is made of the first material (e.g. copper), while the first body portion 114B is made of the second material (e.g. nickel). Similarly, the second via portion 116A is made of the first material (e.g. copper), while the second body portion 116B is made of the second material (e.g. nickel).

As further illustrated in FIG. 14 in some embodiments, the seed layer 112A may include a first section 112A-1 and a second section 112A-2, wherein the first section 112A-1 surrounds the first via portion 114A, while the second section 112A-2 physically separates the first via portion 114A from the first body portion 114B. Similarly, the seed layer 112B may include a first section 112B-1 and a second section 112B-2, wherein the first section 112B-1 surrounds the second via portion 116A, while the second section 112B-2 physically separates the second via portion 116A from the second body portion 116B.

In the embodiment of FIG. 14, since the first body portion 114B and the connection structures 120E are made of the second material (e.g. nickel), due to the less reactive nature of the second material (e.g. nickel), the joints of the connection structures 120E and the first conductive features 114 with the bump structures 122 will result in less intermetallic compound formation. As such, the thicknesses of the first intermetallic compound IMC1 and the second intermetallic compound IMC2 can be controlled in a minimal range, and a joint yield may be improved, while there are less reliability concerns.

Figure 15:
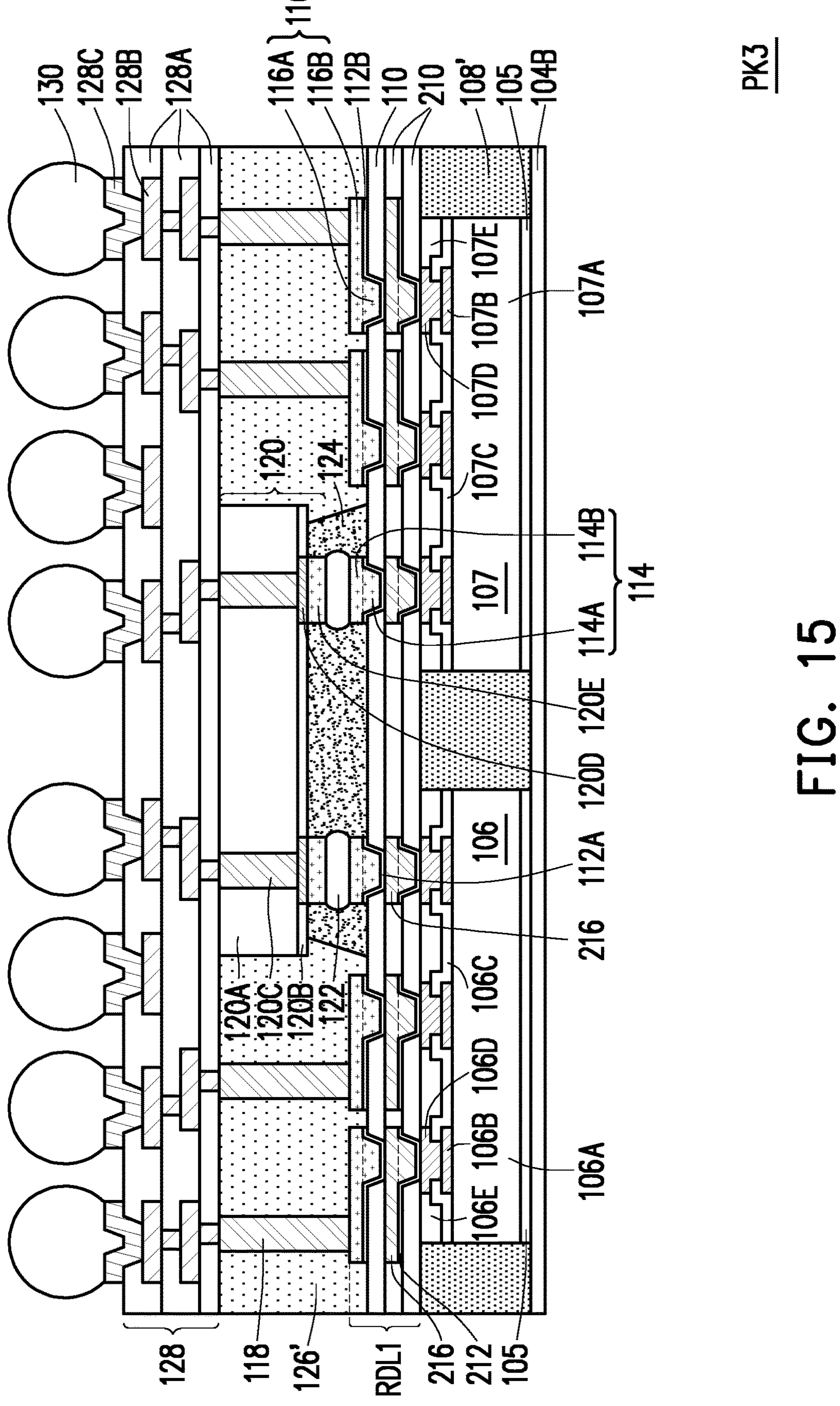
FIG. 15 is a schematic sectional view of a package structure according to some other embodiments of the present disclosure.

FIG. 15 is a schematic sectional view of a package structure according to some other embodiments of the present disclosure. The package structure PK3 (or semiconductor device) illustrated in FIG. 15 is similar to the package structure PK1 illustrated in FIG. 13. Therefore, the same reference numerals are used to refer to the same or liked parts, and its detailed description will be omitted herein. The difference between the embodiments is in the design of the redistribution layer RDL1.

In FIG. 13, the redistribution layer RDL1 includes a dielectric layer 110, seed layers 112A, 112B, first conductive features 114 and second conductive features 116. In other words, the redistribution layer RDL1 is made up of a single layer of dielectric material (dielectric layer 110), and a single layer of conductive materials (first and second conductive features 114, 116). However, the disclosure is not limited thereto, and the redistribution layer RDL1 may include more conductive layers and dielectric layers. For example, referring to FIG. 15, the redistribution layer RDL1 may further include a conductive element layer 216 disposed in between the conductive pillars (106D/107D) and the first conductive features 114, and in between the conductive pillars (106D/107D) and the second conductive features 116. Furthermore, the conductive element layer 216 is located in between two dielectric layers 210, while the conductive element layer 216 are formed over the seed layers 212.

In the exemplary embodiment, a material of the conductive element layer 216 is different than materials of the first conductive features 114 and the second conductive features 116. For example, the conductive element layer 216 may be made of the first material (e.g. copper), while the first conductive features 114 and the second conductive features 116 are made of the second material (e.g. nickel). Although only one conductive element layer 216 and two dielectric layers 210 are illustrated herein, it is noted that the number of conductive element layer 216 and dielectric layer 210 are not limited thereto, and may be adjusted based on design requirements.

In the embodiment of FIG. 15, since the first conductive features 114 and the connection structures 120E are made of the second material (e.g. nickel), due to the less reactive nature of the second material (e.g. nickel), the joints of the connection structures 120E and the first conductive features 114 with the bump structures 122 will result in less intermetallic compound formation. As such, the thicknesses of the first intermetallic compound IMC1 and the second intermetallic compound IMC2 can be controlled in a minimal range, and a joint yield may be improved, while there are less reliability concerns.

Figure 16:
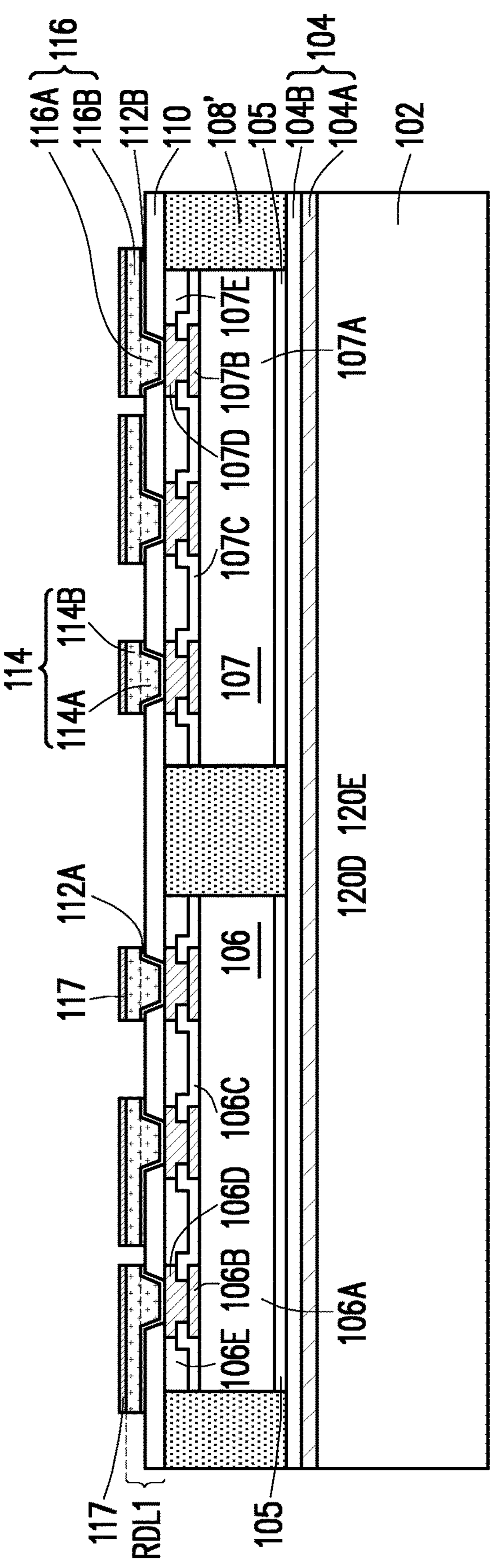
FIG. 16 to FIG. 18 are schematic sectional views of various stages in a method of fabricating a package structure according to some other embodiments of the present disclosure.
Figure 17A:
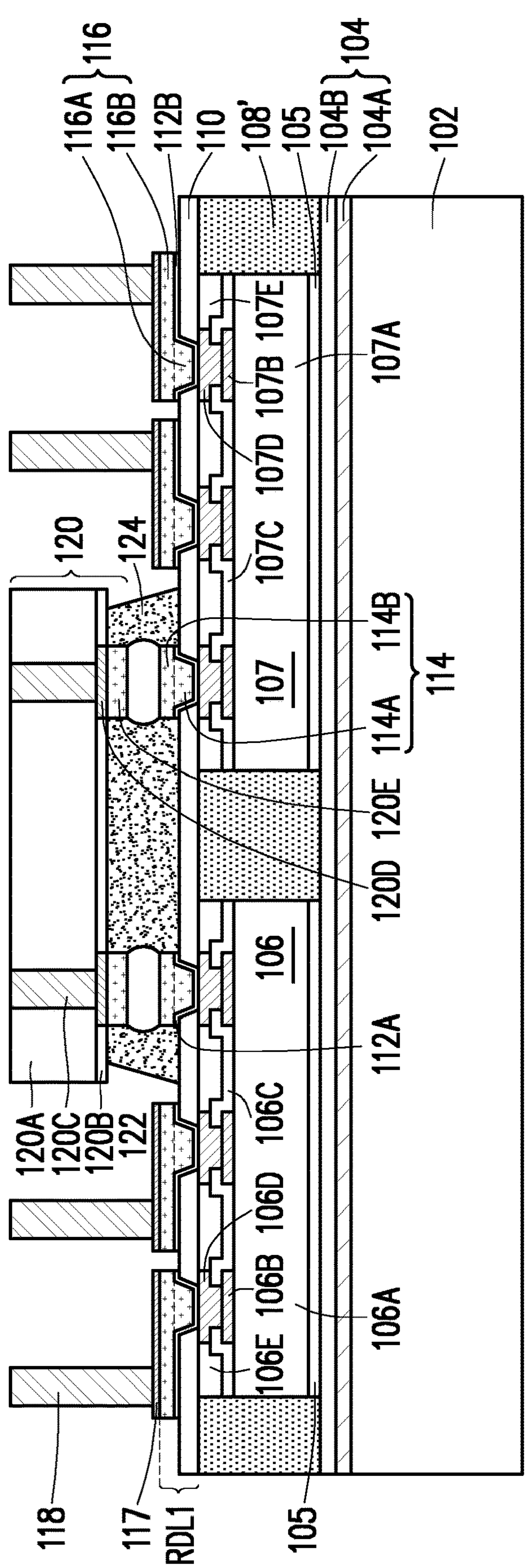
Figure 17B:
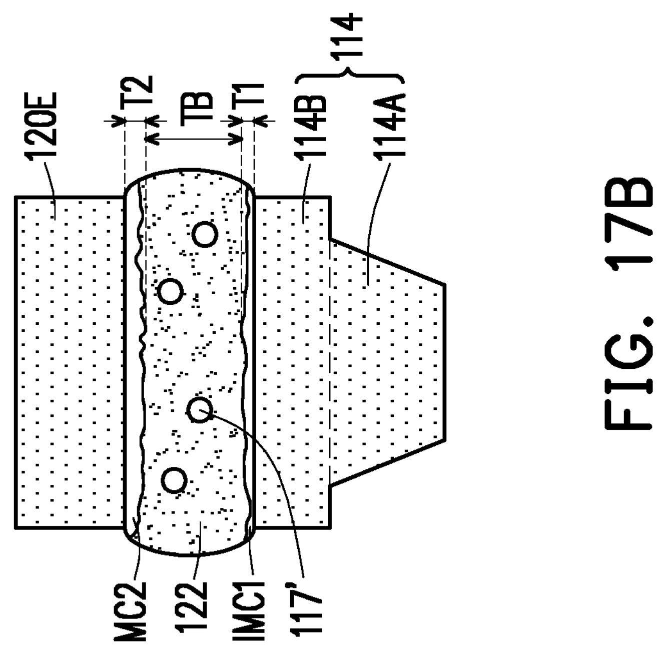
Figure 18:
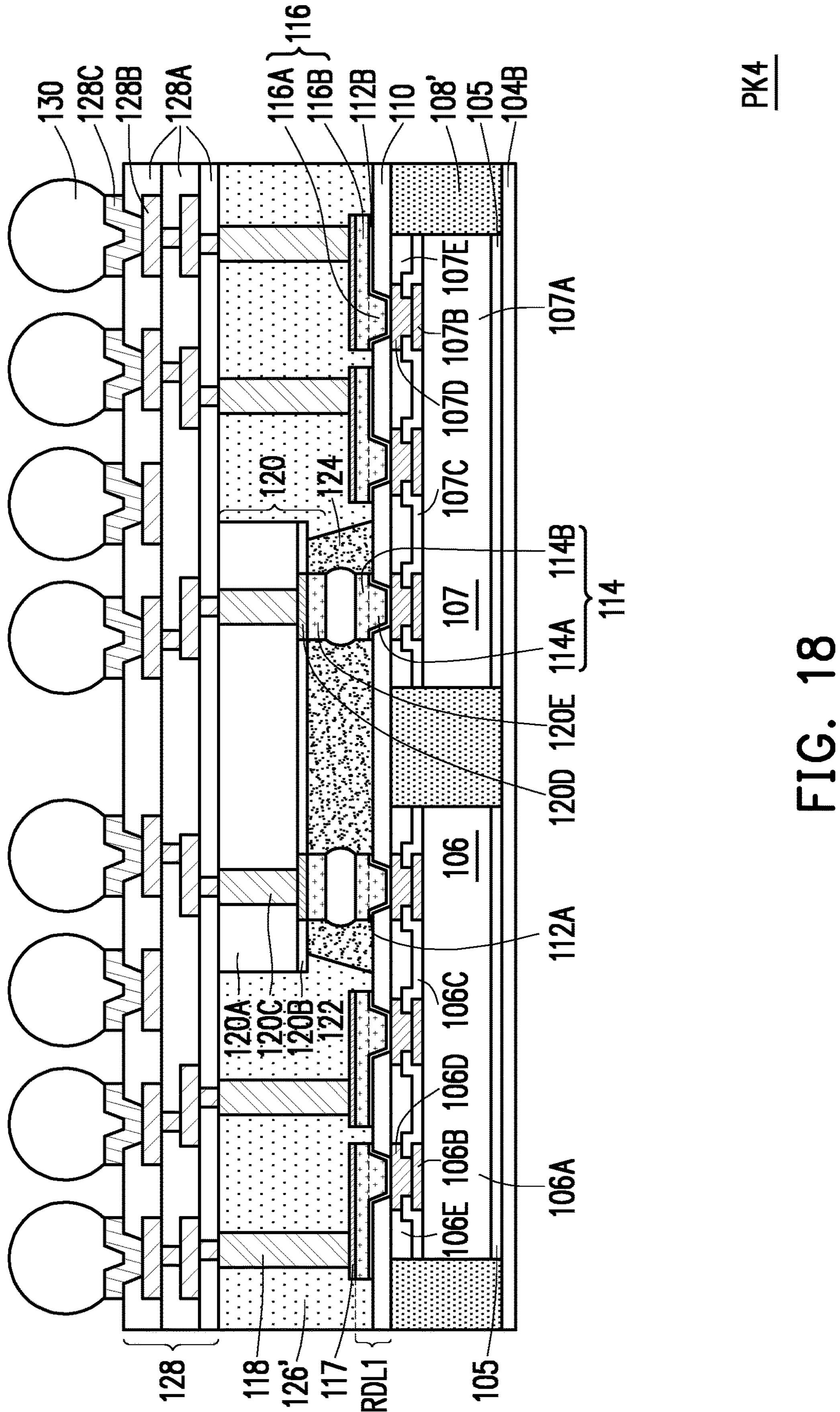

FIG. 16 to FIG. 18 are schematic sectional views of various stages in a method of fabricating a package structure according to some other embodiments of the present disclosure. The method illustrated in FIG. 16 to FIG. 18 is similar to the method illustrated in FIG. 1 to FIG. 13. Therefore, the same reference numerals are used to refer to the same or liked parts, and its detailed description will not be repeated herein. The difference between the embodiments is the presence of a metallic layer 117 in FIG. 16 to FIG. 18.

As illustrated in FIG. 16, the same steps shown in FIG. 1 to FIG. 5 may be performed to form the first conductive features 114 and the second conductive features 116 over the first semiconductor die 106 and the second semiconductor die 107. In some embodiments, a metallic layer 117 is formed as a wetting layer on the first conductive features 114 and on the second conductive features 116. The metallic layer 117 may be a precious metal such as gold (Au), palladium (Pd), platinum (Pt), or the like. In one embodiment, the metallic layer 117 is a gold layer, which may be disposed on the second material (e.g. nickel) of the first conductive features 114 and on the second conductive features 116 to prevent oxidation and improve wettability. The metallic layer 117 is disposed on the first conductive features 114 and the second conductive features 116 in a way that sidewalls of the metallic layer 117 are aligned with sidewalls of the first conductive features 114 and sidewalls of the second conductive features 116.

Referring to FIG. 17A, in a subsequent step, through vias 118 are formed on the metallic layer 117 over the second conductive features 116. The through vias 118 are electrically connected to the second conductive features 116 through the metallic layer 117. Thereafter, an interconnection structure 120 is disposed on the metallic layer 117 over the first conductive features 114. In some embodiments, bump structures 122 are provided in between the metallic layer 117 and the connection structures 120E, and a reflow process is performed so that the bump structures 122 are electrically connected to the first conductive features 114 and the connection structures 120E. In certain embodiments, when performing the reflow process for joining the bump structures 122, the metallic layer 117 will melt and dissolve into the bump structures 122. In other words, the metallic layer 117 formed over the first conductive features 114 will disappear.

For example, referring to an enlarged view of the joints between the connection structures 120E, the bump structures 122 and the first conductive features 114 shown in FIG. 17B, upon the reflow process, the metallic layer 117 will melt to form a metallic element 117', which dissolve into the bump structures 122. For example, if the metallic layer 117 is a gold layer, then gold elements will be dissolved into the bump structures 122 (e.g. solder). In such an embodiment, after performing the reflow process to join the bump structures 122 to the connection structures 120E and the first conductive features 114, a first intermetallic compound IMC1 and a second intermetallic compound IMC2 may be formed. For example, the first intermetallic compound IMC1 may include Au—Sn and Ni—Sn based intermetallic compound, while the second intermetallic compound IMC2 may include Ni—Sn based intermetallic compound. In one embodiment, the first intermetallic compound IMC1 includes $AuSn_4$ and $Ni_3Sn_4$, while the second intermetallic compound IMC2 includes $Ni_3Sn_4$.

As illustrated in FIG. 17B, the first intermetallic compound IMC1 has a maximum thickness of T1, the second intermetallic compound IMC2 has a maximum thickness of T2, while the bump structures 122 have a minimum thickness of TB. In such embodiment, taking a sum of the thickness T1 of the first intermetallic compound IMC1 and the thickness TB of the bump structures 122 as 100%, the thickness T1 of the first intermetallic compound is in a range of 5% to 20% (T1/(T1+TB)). In certain embodiments, taking a sum of the thickness T1 of the first intermetallic compound IMC1 and the thickness TB of the bump structures 122 as 100%, the thickness T1 of the first intermetallic compound is in a range of 5% to 10% (T1/(T1+TB)).

Similarly, taking a sum of the thickness T2 of the second intermetallic compound IMC2 and the thickness TB of the bump structures as 100%, the thickness T2 of the second intermetallic compound is in a range of 5% to 20% (T2/(T2+TB)). In certain embodiments, taking a sum of the thickness T2 of the second intermetallic compound IMC2 and the thickness TB of the bump structures as 100%, the thickness T2 of the second intermetallic compound IMC2 is in a range of 5% to 10% (T2/(T2+TB)).

Referring back to FIG. 17A, upon bonding of the bump structures 122 to the first conductive features 114 and the connection structures 120E, an underfill structure 124 may be formed to fill up the gaps in between the interconnect structure 120 and the redistribution layer RDL1. The underfill structure 124 covers and surrounds the connection structures 120E, the bump structures 122 and the first body portion 114B of the first conductive features 114.

Referring to FIG. 18, the same steps shown in FIG. 9 to FIG. 13 may be performed to form an insulating encapsulant 126' covering the interconnect structure 120 and the through vias 118, and a redistribution layer 128 over the insulating encapsulant 126'. After forming the conducive terminals 130 on the redistribution layer 128 and performing the de-bonding and sawing processes, a package structure PK4 (or semiconductor device) according to some embodiments of the present disclosure may be accomplished.

In the embodiment of FIG. 18, since the first conductive features 114 and the connection structures 120E are made of the second material (e.g. nickel), due to the less reactive nature of the second material (e.g. nickel), the joints of the connection structures 120E and the first conductive features 114 with the bump structures 122 will result in less intermetallic compound formation. As such, the thicknesses of the first intermetallic compound IMC1 and the second intermetallic compound IMC2 can be controlled in a minimal range, and a joint yield may be improved, while there are less reliability concerns.

Figure 19:
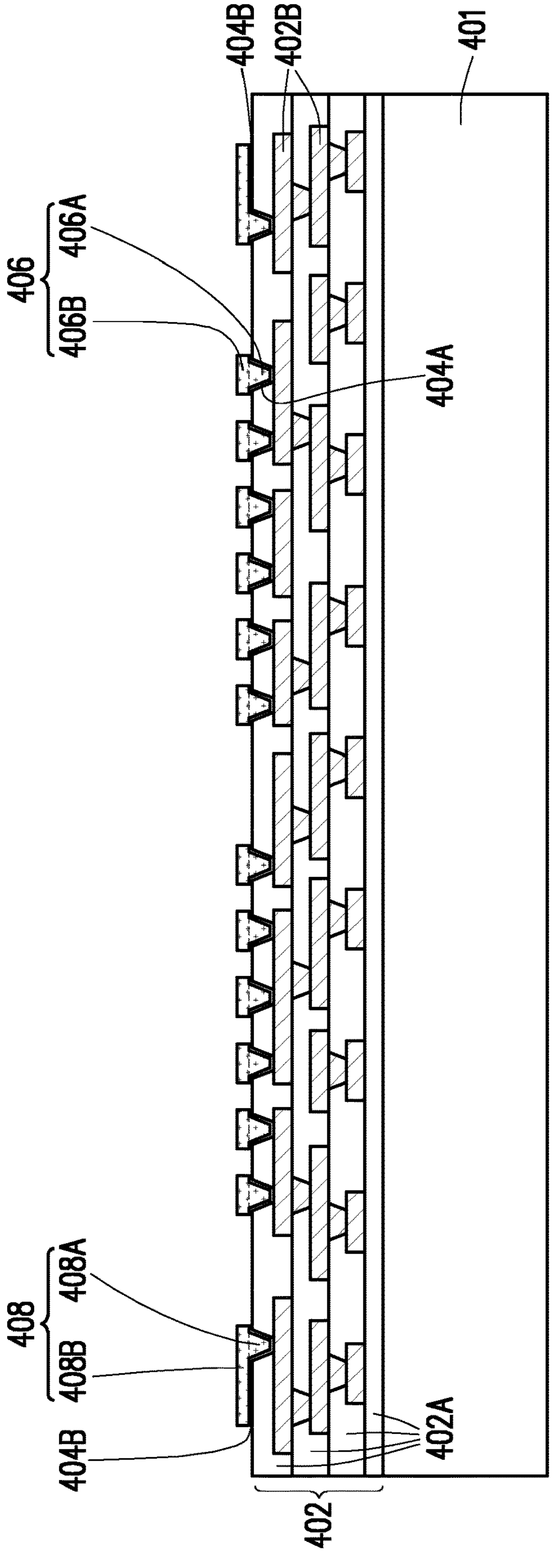
FIG. 19 to FIG. 25 are schematic sectional views of various stages in a method of fabricating a package structure according to some other embodiments of the present disclosure.

FIG. 19 to FIG. 25 are schematic sectional views of various stages in a method of fabricating a package structure according to some other embodiments of the present disclosure. Referring to FIG. 19, a carrier 401 is provided. The carrier 401 may be a glass carrier or any suitable carrier for carrying a semiconductor wafer or a reconstituted wafer used in a method of fabricating the package structure. In some embodiments, an interconnection layer or redistribution layer 402 is formed over the carrier 401. In some embodiments, a de-bonding layer (not shown) may be provided in between the redistribution layer 402 and the carrier 401 to aid in the removal of the carrier 401 in subsequent steps. The formation of the redistribution layer 402 over the carrier 401 (or over the de-bonding layer) includes forming a plurality of dielectric layers 402A and a plurality of conductive elements 402B alternately stacked. For example, the dielectric layers 402A and conductive elements 402B described herein may be similar to the dielectric layers 128A and the conductive elements 128B described in FIG. 11, this its details will not be repeated herein.

As illustrated in FIG. 19, in some embodiments, a seed layer (not shown) may be formed conformally over the topmost dielectric layer 402B and within the openings of the dielectric layer 402B. Thereafter, a conductive material may be formed over the seed layer, whereby the seed layer is patterned to form seed layers 404A, 404B, and the conductive material is patterned to form the first conductive features 406 and the second conductive features 408. The first conductive features 406 and the second conductive features 408 formed herein may be similar to the first conductive features 114 and the second conductive features 116 described in FIG. 5. For example, the first conductive features 406 and the second conductive features 408 may include a second material (e.g. nickel) different from a first material (e.g. copper) of the conductive elements 402B.

In some embodiments, the first conductive features 406 may include a first via portion 406A and a first body portion 406B. The first body portion 406B may be formed of the second material (e.g. nickel), while the first via portion 406A may be formed of the second material (e.g. nickel) or materials (e.g. copper) different from the second material. Similarly, the second conductive features 408 include a second via portion 408A and a second body portion 408B. The second body portion 408B may be formed of the second material (e.g. nickel), while the second via portion 408A may be formed of the second material (e.g. nickel) or materials (e.g. copper) different from the second material.

Figure 20:
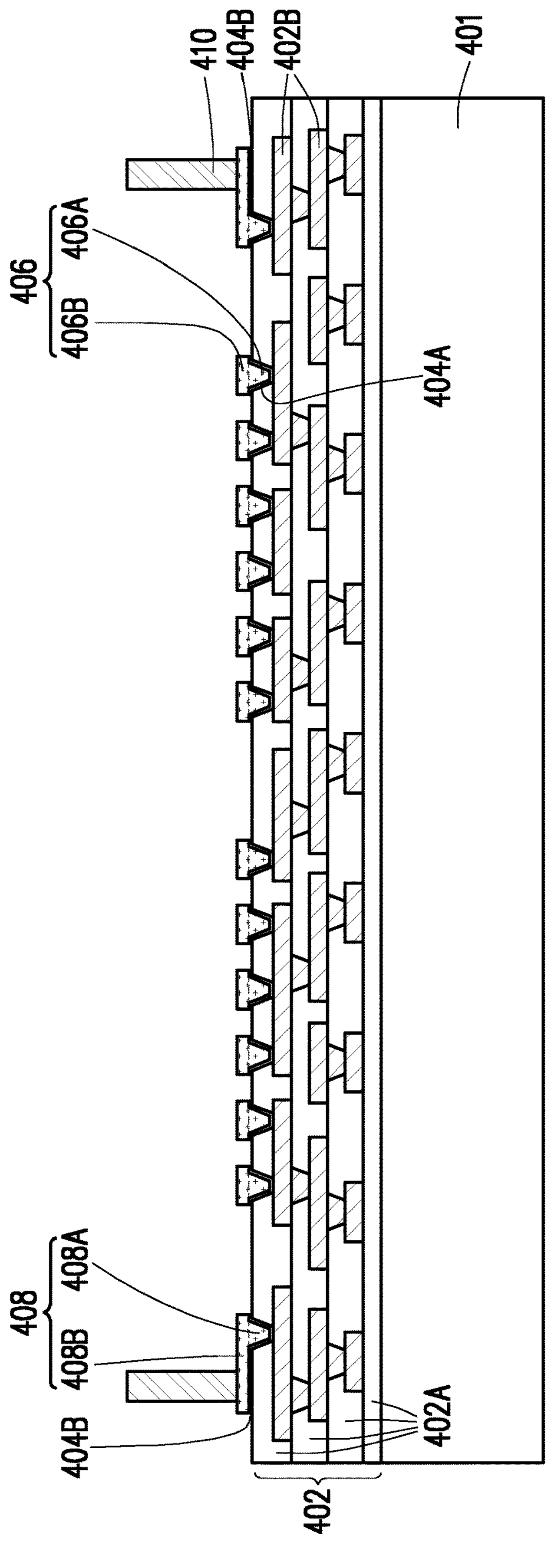
Figure 20:

Referring to FIG. 20, a plurality of through vias 410 may be formed on the second conductive features 408. For example, the through vias 410 are disposed on and electrically connected to the second body portion 408B of the second conductive features 408. In some embodiments, the formation of the through vias 410 includes forming a mask pattern (not shown) with openings, then forming a metallic material (not shown) filling up the openings by electroplating or deposition, and removing the mask pattern to form the through vias 410. In some embodiments, the through vias 410 are made of the first material. For example, the through vias 410 may include a metal material such as copper or copper alloys, or the like.

Figure 21:
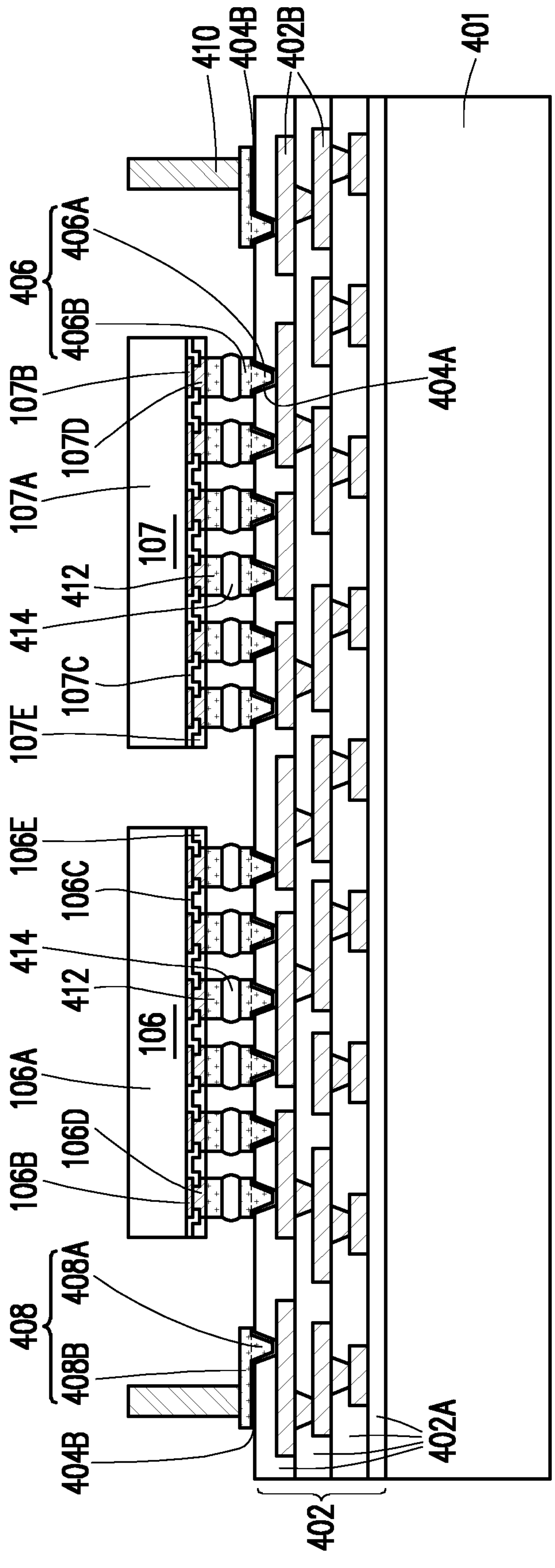

Referring to FIG. 21, in a subsequent step, a first semiconductor die 106 and a second semiconductor die 107 are bonded onto the redistribution layer 402 through flip-chip bonding. The details of the first semiconductor die 106 and the second semiconductor die 107 have been described in FIG. 2, thus will not be repeated herein. In some embodiments, the first semiconductor die 106 and the second semiconductor die 107 are bonded to the first conductive features 406 through a plurality of connection structures 412 and a plurality of bump structures 414. For example, the connection structures 412 are disposed on the conductive pillars (106D/107D) and includes the second material (e.g. nickel), while the bump structures 414 are interposed between the connection structures 412 and the first conductive features 406 and includes a third material (e.g. tin). In some embodiments, a reflow process is performed to join the bump structures 414 to the connection structures 412 and the first conductive features 406. In certain embodiments, after performing the reflow process to join the bump structures 414 to the connection structures 412 and the first conductive features 406, a first intermetallic compound IMC1 and a second intermetallic compound IMC2 (not shown in FIG. 21) similar to that described in FIG. 8A may be formed.

Figure 22:
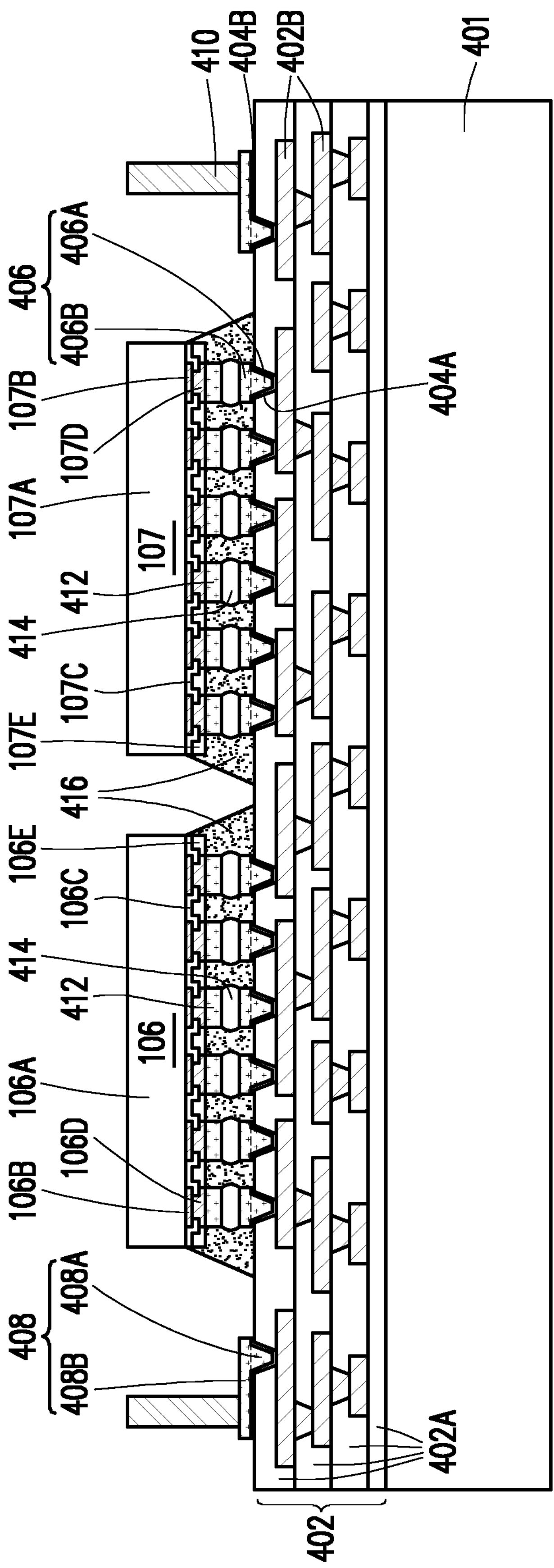

Referring to FIG. 22, after placing the first semiconductor die 106 and the second semiconductor die 107 over the redistribution layer 402, an underfill structure 416 may be formed to fill up the gaps in between the dies (106/107) and the redistribution layer 402. For example, the underfill structure 416 covers and surrounds the connection structures 412, the bump structures 414 and the first body portion 406B of the first conductive features 406. The underfill structure 416 may reduce stress and protect the joints resulting from the reflowing of the bump structures 414. The underfill structure 416 may be applied in liquid or semi-liquid form and then subsequently cured.

Figure 23:
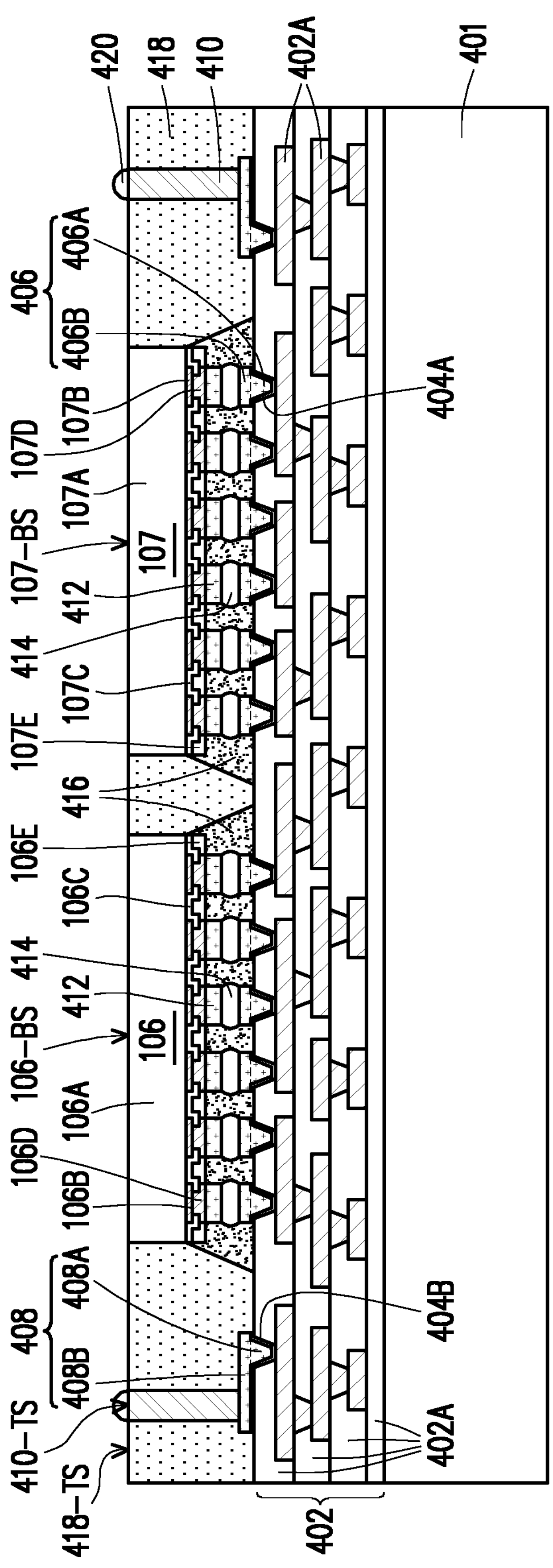

Referring to FIG. 23, in a subsequent step, an insulating encapsulant 418 is formed to encapsulate the first semiconductor die 106, the second semiconductor die 107 and the through vias 410. Thereafter, a planarization step may be performed so that a top surface 418-TS of the insulating encapsulant 418 may be coplanar and levelled with a top surface 410-TS of the through vias 410, a backside surface 106-BS of the first semiconductor die 106 and a backside surface 107-BS of the second semiconductor die 107. In some embodiments, a plurality of conductive terminals 420 are placed on the bottom surfaces of the through vias 410. For example, the conductive terminals 420 are electrically connected to the second conductive features 408 by the through vias 410. In some embodiments, the conductive terminals 420 are, for example, reflowed to bond with the top surfaces 410-TS of the through vias 410.

Figure 24:
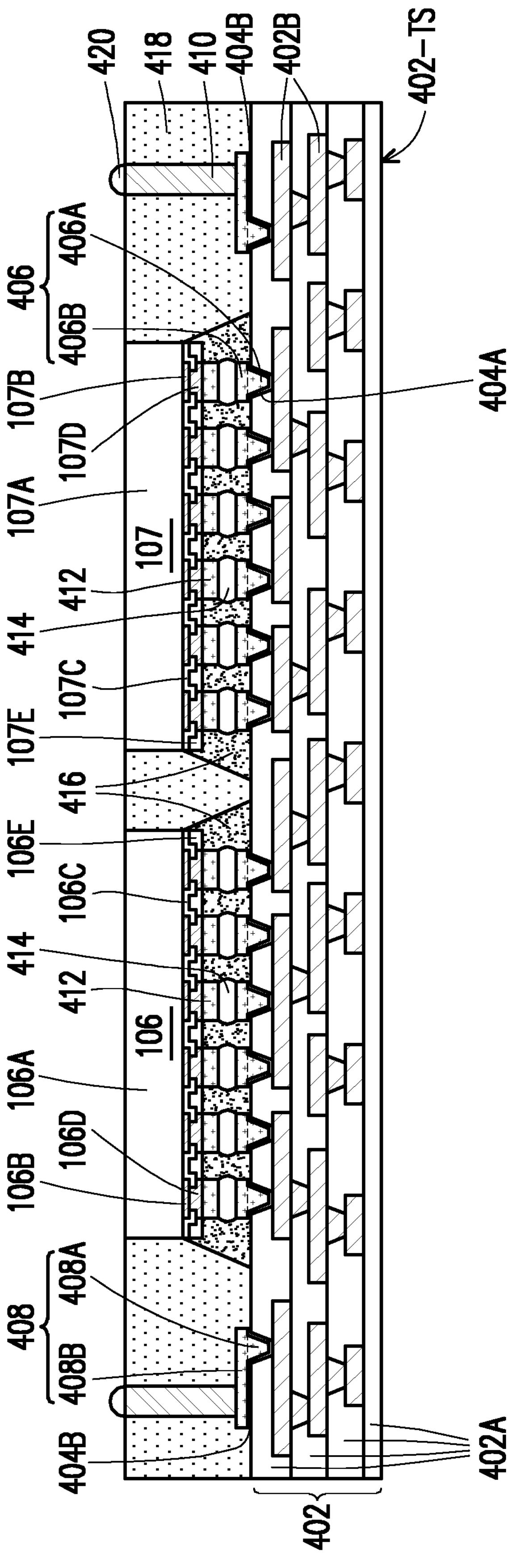

Referring to FIG. 24, after forming the insulating encapsulant 418 and the conductive terminals 420, the carrier 401 is debonded so as to separate the redistribution layer 402 from the carrier 401. For example, the de-bonding process include projecting a light such as a laser light or an UV light on the de-bonding layer (not shown), so that the carrier 401 can be easily removed. After removal of the carrier 401, a top surface 402-TS of the redistribution layer 402 may be exposed.

Figure 25:
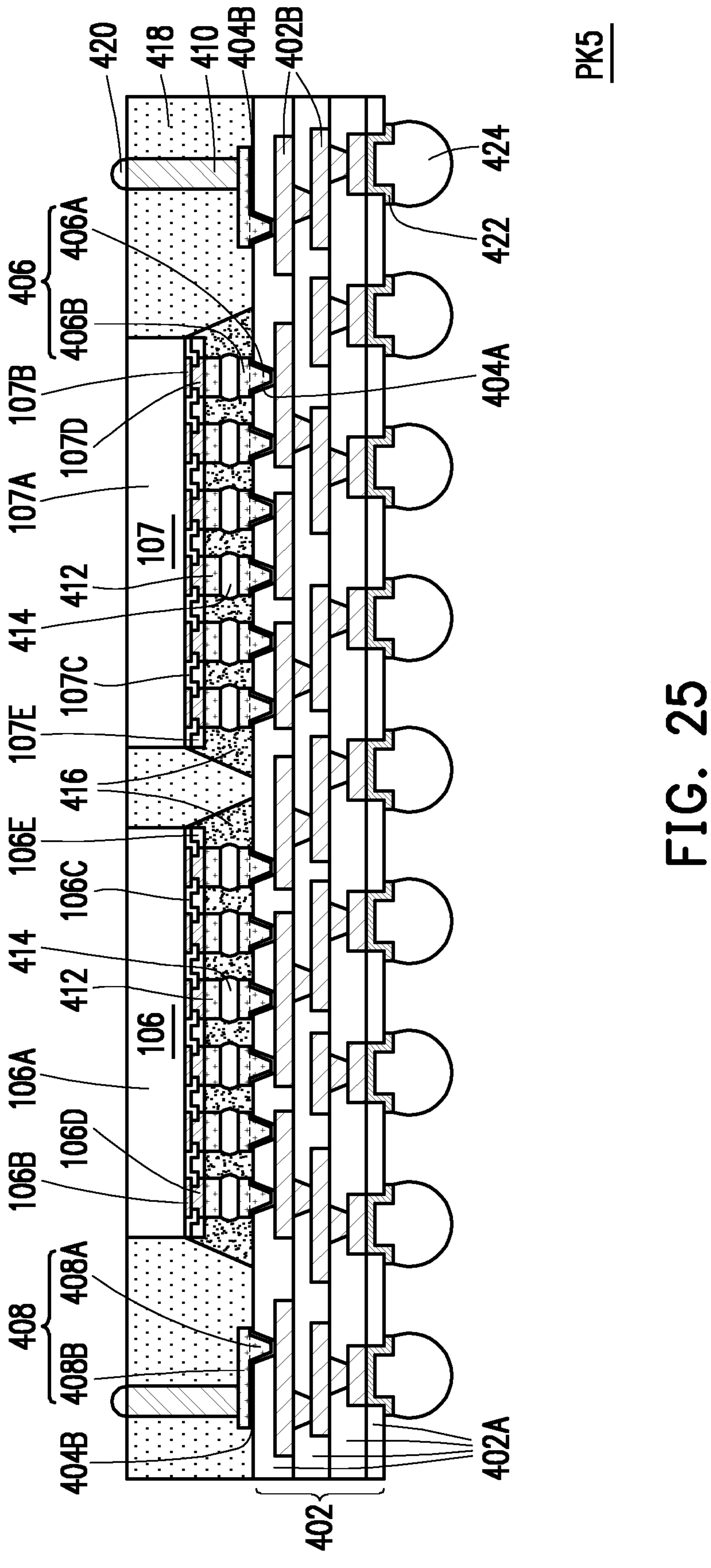

Referring to FIG. 25, in some embodiments, the top surface 402-TS of the redistribution layer 402 is patterned to form a plurality of openings revealing the conductive elements 402B underneath. Subsequently, a plurality of conductive pads 422 may be disposed on an exposed top surface of the topmost layer of the conductive elements 402B. In certain embodiments, the conductive pads 422 are for example, under-ball metallurgy (UBM) patterns used for ball mount. As shown in FIG. 25, the conductive pads 422 are formed on and electrically connected to the redistribution layer 402. After forming the conductive pads 422, a plurality of conducive terminals 424 are disposed on the conductive pads 422 and over the redistribution layer 402. In some embodiments, the conductive terminals 424 may be disposed on the conductive pads 422 by ball placement process or reflow process. After performing a sawing process to separate individual packages, a package structure PK5 (or semiconductor device) according to some embodiments of the present disclosure is accomplished.

In the embodiment of FIG. 25, since the first conductive features 406 and the connection structures 412 are made of the second material (e.g. nickel), due to the less reactive nature of the second material (e.g. nickel), the joints of the connection structures 412 and the first conductive features 406 with the bump structures 414 will result in less intermetallic compound formation. As such, the thicknesses of the first intermetallic compound IMC1 and the second intermetallic compound IMC2 can be controlled in a minimal range, and a joint yield may be improved, while there are less reliability concerns.

According to the above embodiments, the package structure includes a bump structure for providing interconnection between the connection structures and the first conductive features. As the connection structures and the first conductive features are made of a nickel material, due to the less reactive nature of nickel, the joints of the connection structures and the first conductive features with the bump structures (e.g. solder) will result in less intermetallic compound formation. As such, a low joint yield and reliability concern of the bump structures due to thick intermetallic compound formation during bonding may be resolved. Overall, even when the size of the bump structures is scaled down to meet design requirements, minimal intermetallic compounds are formed between the joints of the bump structures, and a reliability of the package structure may be improved.

In accordance with some embodiments of the present disclosure, a package structure includes a semiconductor die, a first insulating encapsulant, a plurality of first conductive features, an interconnect structure and bump structures. The semiconductor die includes a plurality of conductive pillars made of a first material. The first insulating encapsulant is encapsulating the semiconductor die. The first conductive features are disposed on the semiconductor die and electrically connected to the conductive pillars. The first conductive features include at least a second material different from the first material. The interconnect structure is disposed on the first conductive features, wherein the interconnect structure includes a plurality of connection structures made of the second material. The bump structures are electrically connecting the first conductive features to the connection structures, wherein the bump structures include a third material different from the first material and the second material.

In accordance with some embodiments of the present disclosure, a semiconductor device includes an interconnect structure, through vias, conductive pillars, a redistribution layer, bump structures and a first intermetallic compound. The interconnect structure includes a plurality of connection structures. The through vias are surrounding the interconnect structure. The conductive pillars are electrically connected to the interconnect structure and the through vias. The redistribution layer is disposed on the conductive pillars and includes a plurality of first conductive features and a plurality of second conductive features, the first conductive features are electrically connecting the connection structures to the conductive pillars, and the second conductive features are electrically connecting the through vias to the conductive pillars. The bump structures are disposed in between the connection structures and the first conductive features. The first intermetallic compound is sandwiched in between the first conductive features and the bump structures, wherein taking a sum of a thickness T1 of the first intermetallic compound and a thickness TB of the bump structures as 100%, the thickness T1 of the first intermetallic compound is in a range of 5% to 20%.

In accordance with yet another embodiment of the present disclosure, a method of fabricating a package structure is described. The method includes the following steps. A semiconductor die is provided, the semiconductor die includes plurality of conductive pillars made of a first material. A first insulting encapsulant is formed to encapsulate the semiconductor die. A plurality of first conductive features is formed on the semiconductor die and electrically connected to the plurality of conductive pillars, wherein the plurality of first conductive features includes at least a second material different from the first material. An interconnect structure is provided over the plurality of first conductive features, wherein the interconnect structure includes a plurality of connection structures made of the second material. Bump structures are provided in between the plurality of first conductive features and the plurality of connection structures, and a reflow process is performed so that the bump structures are electrically joining the plurality of first conductive features to the plurality of connection structures. The bump structures include a third material different from the first material and the second material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a package structure, comprising:

forming a first insulating encapsulant encapsulating a plurality of semiconductor dies, wherein the plurality of semiconductor dies comprises a plurality of conductive pillars made of a first material;

forming a redistribution layer disposed on and electrically connected to the plurality of semiconductor dies, wherein the redistribution layer consists of a dielectric layer, first seed layers, second seed layers, and copper-free conductive features, and forming the redistribution layer comprises:

forming the dielectric layer on the first insulating encapsulant, and patterning the dielectric layer to form openings revealing the plurality of conductive pillars;

forming a seed layer in the openings of the dielectric layer, and patterning the seed layer to form the first seed layers and the second seed layers separated from one another, wherein the first seed layers are electrically connected to a first portion of the plurality of conductive pillars, and the second seed layers are electrically connected to a second portion of the plurality of conductive pillars, wherein the first seed layers and the second seed layers include titanium;

forming copper-free conductive features on the first seed layers and the second seed layers, wherein the forming of the copper-free conductive features comprises forming a plurality of first conductive features on the first seed layers, and forming a plurality of second conductive features on the second seed layers, wherein the plurality of first conductive features and the plurality of second conductive features respectively includes a nickel via portion and a nickel body portion, and a bottom surface and sidewalls of the nickel via portion is surrounded by the first seed layers or the second seed layers, and the nickel body portion is directly disposed on the nickel via portion, and sidewalls and a top surface of the nickel body portion are uncovered by the first seed layers and the second seed layers, and wherein the nickel via portion and the nickel body portion of the plurality of first conductive features are vertically aligned with the first portion of the plurality of conductive pillars along a build-up direction;

forming a plurality of through vias on the nickel body portion of the plurality of second conductive features, wherein the plurality of through vias is misaligned with the second portion of the plurality of conductive pillars along the build-up direction, and is made of the first material;

providing an interconnect structure over the plurality of first conductive features, wherein the interconnect structure comprises a plurality of connection structures made of nickel, wherein the plurality of through vias is surrounding the interconnect structure; and providing bump structures in between the nickel body portion of the plurality of first conductive features and the plurality of connection structures, and performing a reflow process so that the bump structures are electrically joining the plurality of first conductive features to the plurality of connection structures, wherein the bump structures comprise a second material different from the first material and different from nickel.

2. The method according to claim 1, wherein after performing the reflow process, a first intermetallic compound is formed between the plurality of first conductive features and the bump structures, wherein taking a sum of a thickness T1 of the first intermetallic compound and a thickness TB of the bump structures as 100%, the thickness T1 of the first intermetallic compound is in a range of 5% to 20%, and a second intermetallic compound is formed between the plurality of connection structures and the bump structures, wherein taking a sum of a thickness T2 of the second intermetallic compound and the thickness TB of the bump structures as 100%, the thickness T2 of the second intermetallic compound is in a range of 5% to 20%.

3. The method according to claim 1, wherein the precious metal layer is a gold layer, and after performing a reflow process to join the bump structures to the plurality of first conductive features, the gold layer dissolves to form an Au-Sn based intermetallic compound between the plurality of first conductive features and the bump structures.

4. The method according to claim 3, wherein after performing the reflow process, the gold layer melts to form gold elements located in the bump structures.

5. The method according to claim 1, wherein the precious metal layer is formed over the plurality of second conductive features prior to forming the plurality of through vias, and the plurality of through vias is formed directly on the precious metal layer and over the plurality of second conductive features.

6. The method according to claim 1, further comprising forming a second insulating encapsulant disposed on the first insulating encapsulant and encapsulating the interconnection structure and the bump structures.

7. The method according to claim 1, wherein the nickel body portion of the plurality of second conductive features is formed to extend from a position over a top surface of the second portion of the plurality of conductive pillars towards a position beyond sidewalls of the plurality of semiconductor dies.

8. A method, comprising:

forming first conductive features and second conductive features disposed on and electrically connected to a semiconductor die, wherein the first conductive features and the second conductive features are vertically overlapped with the semiconductor die and are made of nickel;

forming a first metallic layer on the first conductive features and forming a second metallic layer on the second conductive features, wherein the first metallic layer and the second metallic layer are vertically overlapped with the semiconductor die, and a bottom surface of the first metallic layer is horizontally aligned with a bottom surface of the second metallic layer, and a top surface of the first metallic layer is horizontally aligned with a top surface of the second metallic layer;

providing an interconnection die comprising through substrate vias, conductive pads disposed on the through substrate vias, and nickel-containing connection structures electrically connected to the conductive pads, wherein the through substrate vias, the conductive pads and the nickel-containing connection structures are vertically overlapped with one another;

after forming the nickel-containing connection structures on the interconnection die, bonding the interconnection die to the semiconductor die by joining the first conductive features to the nickel-containing connection structures through a plurality of bump structures, wherein the plurality of bump structures contains tin, and performing a reflow process to melt the first metallic layer so that a metallic element is formed in the plurality of bump structures, and wherein after the reflow process, a bottom surface of the plurality of bump structures is aligned with a bottom surface of the second metallic layer;

forming through vias directly on the second metallic layer, and over the second conductive features;

forming an underfill structure laterally surrounding and contacting the first conductive features, the nickel-containing connection structures of the interconnection die and the plurality of bump structures, wherein the underfill structure is vertically non-overlapped with the through substrate vias of the interconnection die; and after forming the through vias, forming an insulating encapsulant covering and contacting a portion of the second metallic layer that is vertically overlapped with the semiconductor die, and wherein the insulating encapsulant is laterally surrounding the through vias.

9. The method according to claim 8, wherein joining the first conductive features to the nickel-containing connection structures through the plurality of bump structures comprises performing the reflow process to form a first intermetallic compound between the first conductive features and the plurality of bump structures, and to form a second intermetallic compound between the nickel-containing connection structures and the plurality of bump structures.

10. The method according to claim 9, wherein the first intermetallic compound comprises $AuSn_4$ and $Ni_3Sn_4$, and the second intermetallic compound includes $Ni_3Sn_4$.

11. The method according to claim 9, wherein taking a sum of a thickness T1 of the first intermetallic compound and a thickness TB of the bump structures as 100%, the first intermetallic compound is formed with the thickness T1 in a range of 5% to 20%, and taking a sum of a thickness T2 of the second intermetallic compound and the thickness TB of the bump structures as 100%, the second intermetallic compound is formed with the thickness T2 in a range of 5% to 20%.

12. The method according to claim 8, wherein the first metallic layer and the second metallic layer are made from a material selected from the group consisting of gold (Au), palladium (Pd) and platinum (Pt).

13. The method according to claim 8, wherein the metallic element formed in the plurality of bump structures include gold elements.

14. The method according to claim 8, wherein after forming the underfill structure, a top surface of the underfill structure is aligned with an interface between the nickel-containing connection structures and the conductive pads.

15. A method, comprising:

forming first conductive features and second conductive features over a substrate, wherein the first conductive features and the second conductive features have aligned top surfaces;

forming a precious metal layer on the top surfaces of the first conductive features and the second conductive features;

providing an interconnection die, comprising a die substrate, through substrate vias embedded in the die substrate, and connection structures disposed on the through substrate vias; and performing a reflow process to join a plurality of bump structures to the connection structures and the first conductive features, wherein during the reflow process, the plurality of bump structures and the precious metal layer are sandwiched between two nickel-containing interfaces of the connection structures and the first conductive features, and after the reflow process, a first intermetallic compound consisting of $AuSn_4$ and $Ni_3Sn_4$ is formed between the first conductive features and the plurality of bump structures, a second intermetallic compound consisting of $Ni_3Sn_4$ is formed between the connection structures and the plurality of bump structures, and the plurality of bump structures have a greater thickness than the first intermetallic compound and the second intermetallic compound, the precious metal layer on the first conductive features is melted during the reflow process and dissolved into the plurality of bump structures so that metal elements originating from the precious metal layer are located in the plurality of bump structures and physically separated from the first intermetallic compound and the second intermetallic compound, while the precious metal layer is retained on the second conductive features, and the metal elements are vertically overlapped with the through substrate vias of the interconnection die;

forming through vias on the precious metal layer over the second conductive features;

forming an insulating encapsulant surrounding the interconnection die and the through vias; and performing a thinning step to remove portions of the insulating encapsulant to reveal a top surface of the through vias and a top surface of the through substrate vias of the interconnection die, wherein the top surface of the through vias, the top surface of the through substrate vias and a top surface of the insulating encapsulant are coplanar and levelled with one another after the thinning step.

16. The method according to claim 15, wherein the precious metal layer comprises gold (Au), palladium (Pd) or platinum (Pt).

17. The method according to claim 15, further comprising:

forming an underfill structure surrounding the first conductive features, the connection structure and the plurality of bump structures, and forming the insulating encapsulant to surround the underfill structure.

18. The method according to claim 15, further comprises forming a redistribution layer on the insulating encapsulant, wherein the redistribution layer is electrically connected to the through vias and the through substrate vias of the interconnection die.

19. The method according to claim 15, wherein prior to forming the first conductive features and the second conductive features, the method further comprises:

placing a first semiconductor die and a second semiconductor die over the substrate, wherein the first semiconductor die and the second semiconductor die comprises a plurality of conductive pillars;

forming the first conductive features and the second conductive features on the plurality of conductive pillars of the first semiconductor die and the second semiconductor die, and over the substrate, and wherein after performing the reflow process, the metal elements are further vertically overlapped with a portion of plurality of conductive pillars of the first semiconductor die and the second semiconductor die, and the precious metal layer retained on the second conductive features is vertically overlapped with another portion of plurality of conductive pillars of the first semiconductor die and the second semiconductor die.

20. The method according to claim 15, wherein after the thinning step to reveal the top surface of the through vias and the top surface of the through substrate vias, a redistribution layer is formed on the interconnection die and the insulating encapsulant, wherein forming the redistribution layer comprises:

forming first conductive via portions electrically connected to the top surface of the through vias and the top surface of the through substrate vias, and forming a first dielectric layer laterally surrounding the first conductive via portions, and a height of the first dielectric layer is equal to a height of the first conductive via portions;

forming conductive elements disposed on and electrically connected to the first conductive via portions; and forming second conductive via portions disposed on and electrically connected to the conductive elements, and forming a second dielectric layer disposed on the first dielectric layer, and laterally surrounding the conductive elements and the second conductive via portions.

* * * * *